United States Patent
Kim

(10) Patent No.: US 12,236,101 B2
(45) Date of Patent: Feb. 25, 2025

(54) SYSTEM AND METHOD FOR MEMORY BAD BLOCK MAMAGEMENT

(71) Applicant: Samsung Electronics Co., Ltd., Suwon-si (KR)

(72) Inventor: Hyunseok Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/352,509

(22) Filed: Jul. 14, 2023

(65) Prior Publication Data

US 2024/0241646 A1    Jul. 18, 2024

(30) Foreign Application Priority Data

Jan. 18, 2023 (KR) .................. 10-2023-0007201

(51) Int. Cl.
*G06F 3/06* (2006.01)
*G06F 12/02* (2006.01)

(52) U.S. Cl.
CPC .......... *G06F 3/0616* (2013.01); *G06F 3/0631* (2013.01); *G06F 3/0658* (2013.01); *G06F 3/0673* (2013.01); *G06F 12/0292* (2013.01); *G06F 2212/1036* (2013.01)

(58) Field of Classification Search
CPC ......... G06F 12/0284; G06F 2212/1032; G06F 11/1008; G06F 11/1024; G06F 11/14–1402; G06F 12/0292; G06F 3/06
See application file for complete search history.

(56) References Cited

U.S. PATENT DOCUMENTS

| | | | |
|---|---|---|---|
| 6,754,117 B2 | 6/2004 | Jeddeloh | |
| 6,819,608 B2 | 11/2004 | Watanabe | |
| 8,495,435 B2* | 7/2013 | Morris | G06F 13/1642 |
| | | | 711/3 |
| 9,099,165 B1 | 8/2015 | Lee | |
| 9,318,168 B2 | 4/2016 | Park et al. | |
| 9,542,285 B2 | 1/2017 | Miyazaki et al. | |
| 10,395,750 B2 | 8/2019 | Berke et al. | |
| 11,302,414 B2 | 4/2022 | Kim et al. | |
| 2006/0291304 A1* | 12/2006 | Rothman | G11C 29/82 |
| | | | 365/200 |

(Continued)

FOREIGN PATENT DOCUMENTS

CN    103389920 A    11/2013

*Primary Examiner* — Khoa D Doan
(74) *Attorney, Agent, or Firm* — Harness, Dickey & Pierce, P.L.C.

(57) ABSTRACT

A memory system includes a memory module and a memory controller to control semiconductor memory devices in the memory module. Each of the semiconductor memory devices provides the memory controller with an address of at least a defective memory cell row unrepairable with a redundancy resource in a memory cell array as unrepairable address information. The memory controller allocates a portion of a normal cell regions of at least one of the semiconductor memory devices as a reserved region, and remaps first and second unrepairable addresses to first and second physical addresses of the reserved region in response to first and second host physical addresses from a host matching the first and second unrepairable addresses, respectively. The first physical address and the second physical address are consecutive.

20 Claims, 20 Drawing Sheets

(56) References Cited

U.S. PATENT DOCUMENTS

2014/0372838 A1    12/2014  Lou et al.
2020/0363965 A1*  11/2020  Lee .......................... G06F 3/064
2023/0307076 A1*   9/2023  Lim ...................... G06F 3/0619

* cited by examiner

URA(HPA)

| RA | CA | BA | BG | CS | CID |

HTG

| BA | CS | CID |

FIG. 15

| X | CID0 | CID1 | RA12 | RA11 | RA10 | RA9 | RA8 | RA7 | RA6 | RA5 | RA4 | RA3 | RA2 | RA1 | RA0 | CS0 |
|---|------|------|------|------|------|-----|-----|-----|-----|-----|-----|-----|-----|-----|-----|-----|
| URA1 | 0 | 0 | 1 | 1 | 0 | 0 | 0 | 1 | 1 | 0 | 1 | 1 | 1 | 0 | 1 | 0 |
| URA2 | 1 | 1 | 1 | 1 | 0 | 1 | 1 | 1 | 0 | 0 | 0 | 1 | 1 | 0 | 0 | 0 |
| URA3 | 0 | 1 | 0 | 0 | 1 | 1 | 1 | 0 | 0 | 1 | 0 | 0 | 0 | 1 | 1 | 1 |
| URA4 | 0 | 1 | 0 | 1 | 0 | 0 | 0 | 1 | 0 | 0 | 1 | 1 | 1 | 1 | 1 | 1 |

| X | BA1 | BA0 | CA8 | CA7 | CA6 | CA5 | CA4 | CA3 | CA2 | CA1 | CA0 | BG2 | BG1 | BG0 | HTG(BA,CS,CID) |
|---|-----|-----|-----|-----|-----|-----|-----|-----|-----|-----|-----|-----|-----|-----|----------------|
| URA1 | 0 | 0 | 0 | 1 | 1 | 1 | 1 | 1 | 1 | 1 | 1 | 1 | 1 | 1 | 00111000 |
| URA2 | 0 | 0 | 1 | 1 | 1 | 1 | 0 | 0 | 0 | 1 | 1 | 1 | 0 | 1 | 00101011 |
| URA3 | 0 | 1 | 0 | 0 | 1 | 1 | 0 | 0 | 0 | 0 | 1 | 1 | 1 | 1 | 01111101 |
| URA4 | 0 | 1 | 0 | 0 | 1 | 1 | 1 | 0 | 1 | 1 | 0 | 1 | 1 | 1 | 01111101 |

SYSTEM AND METHOD FOR MEMORY BAD BLOCK MAMAGEMENT

CROSS-REFERENCE TO RELATED APPLICATION

This application claims priority under 35 USC § 119 to Korean Patent Application No. 10-2023-0007201, filed on Jan. 18, 2023, in the Korean Intellectual Property Office (KIPO), the disclosure of which is incorporated herein by reference in its entirety.

BACKGROUND

Various example embodiments relate generally to memory devices, and more particularly to memory systems and/or methods for operating memory systems, which may increase usability.

A memory device may be implemented using a semiconductor such as silicon (Si), germanium (Ge), gallium arsenide (GaAs), indium phosphide (InP), and/or the like. Memory devices are typically divided into volatile memory devices and nonvolatile memory devices.

A volatile memory device refers to a memory device in which stored data is lost when a power supply is shut down. On the other hand, a nonvolatile memory device refers to a memory device that retains stored data when a power supply is shut down. Because a dynamic random access memory (DRAM), which is a kind of volatile memory device, has a high access speed, the DRAM is widely used as a working memory, a buffer memory, a main memory, or the like of a computing system.

A plurality of volatile memory devices may be provided in the form of memory modules for a relatively large storage capacity. Thus, repair capability on defective memory cells may be important in the memory module.

SUMMARY

Some example embodiments provide a memory system capable of increasing usability of defective memory cell rows.

Alternatively or additionally, some example embodiments provide a method of operating a memory system capable of increasing usability of defective memory cell rows.

According to some example embodiments, a memory system includes a memory module including a plurality of semiconductor memory devices, and a memory controller connected to at least one host through a serial interface. The memory controller is configured to control the plurality of semiconductor memory devices. Each of the plurality of semiconductor memory devices includes a memory cell array that includes a normal cell region and a redundancy region, and is configured to provide the memory controller with an address of at least a first defective memory cell row from among defective memory cell rows in the normal cell region as an unrepairable address information. The at least first defective memory cell row is unrepairable with a redundancy resource of the redundancy region. The memory controller is configured to allocate a portion of the normal cell regions of at least one of the plurality of semiconductor memory devices as a reserved region, to remap a first unrepairable address to a first physical address of the reserved region in response to a first host physical address from the at least one host matching the first unrepairable address in the unrepairable address information, and to remap a second unrepairable address to a second physical address of the reserved region in response to a second host physical address from the at least one host matching the second unrepairable address in the unrepairable address information. The first physical address and the second physical address are consecutive.

Alternatively or additionally according to some example embodiments, there is provided a method of operating a memory system which includes a memory module including a plurality of semiconductor memory devices and a memory controller connected to at least one host through a serial interface, and configured to control the plurality of semiconductor memory devices. Each of the plurality of semiconductor memory devices includes a memory cell array including a normal cell region and a redundancy region. The method includes performing a test on a plurality of memory cells in the memory cell array, in each of the plurality of semiconductor memory devices. The method includes storing during a test mode and in a nonvolatile storage in the memory controller addresses of defective memory cell rows that are unrepairable with a redundancy resource of the redundancy region as unrepairable address, The method further includes, based on a result of the test, allocating a portion of the normal cell regions of at least one of the plurality of semiconductor memory devices as a reserved region by the memory controller based on the unrepairable addresses, and remapping the unrepairable addresses, by the memory controller, to consecutive physical addresses of the reserved region, in response to the at least one host accessing defective memory cell rows corresponding to the unrepairable addresses.

Alternatively or additionally according to some example embodiments, a memory system includes a memory module including a plurality of semiconductor memory devices and a memory controller connected to at least one host through a serial interface. The memory controller is configured to control the plurality of semiconductor memory devices. Each of the plurality of semiconductor memory devices includes a memory cell array that includes a normal cell region and a redundancy region, and is configured to provide provides the memory controller with an address of at least a first defective memory cell row from among defective memory cell rows in the normal cell region as an unrepairable address information. The at least first defective memory cell row is unrepairable with a redundancy resource of the redundancy region. The memory controller includes a bad block manager and a remapping engine. The bad block manager is configured to allocate a portion of the normal cell regions of at least one of the plurality of semiconductor memory devices as a reserved region based on the unrepairable address information. The remapping engine is configured to remap a first unrepairable address to a first physical address of the reserved region in response to a first host physical address from the at least one host matching the first unrepairable address in the unrepairable address information, and to remap a second unrepairable address to a second physical address of the reserved region in response to a second host physical address from the at least one host matching the second unrepairable address in the unrepairable address information. The first physical address and the second physical address are consecutive.

Therefore, a memory system and/or a method of operating a memory system according to some example embodiments may increase usability of the memory module by allocating a portion of the normal cell region as a reserved region and by remapping at least one unrepairable address, which exceeds the redundancy resource of the redundancy region of each of the plurality of semiconductor memory devices, to consecutive physical addresses of the reserved region.

BRIEF DESCRIPTION OF THE DRAWINGS

Illustrative, non-limiting example embodiments will be more clearly understood from the following detailed description taken in conjunction with the accompanying drawings.

FIG. 15 illustrates an example that the hashing logic generates the hash tags based on the unrepairable addresses in FIG. 12 according to various example embodiments.

DETAILED DESCRIPTION OF VARIOUS EXAMPLE EMBODIMENTS

Figure 1:
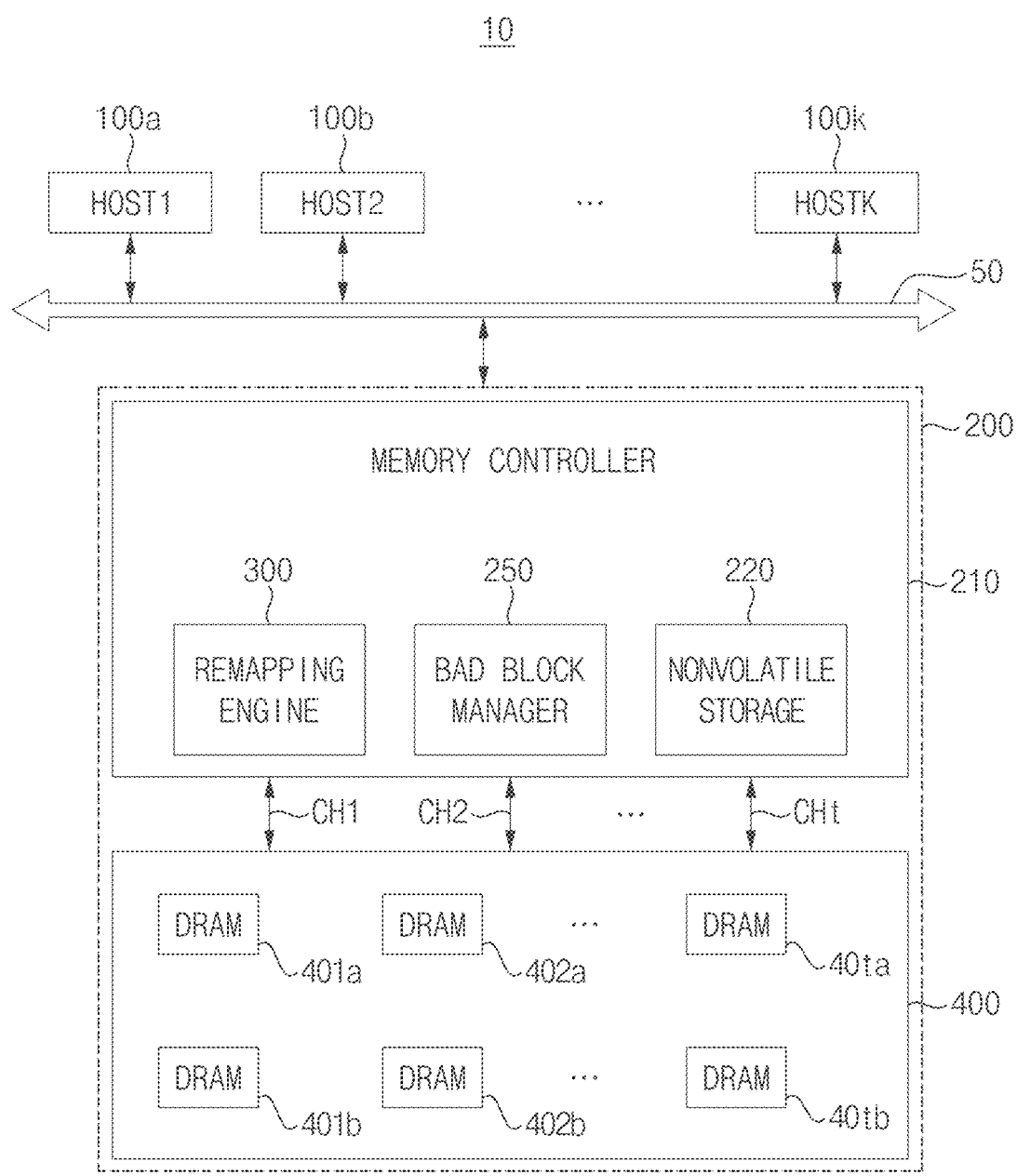
FIG. 1 is a block diagram illustrating a computing system according to various example embodiments.

Various example embodiments will be described more fully with reference to the accompanying drawings, in which embodiments are shown. The present disclosure may however, be embodied in many different forms and should not be construed as limited to the embodiments set forth herein. Like reference numerals refer to like elements throughout this application.

FIG. 1 is a block diagram illustrating a computing system according to various example embodiments.

Referring to FIG. 1, a computing system 10 may include a plurality of hosts HOST1 (100a), HOST2 (100b), . . . , HOSTK (100k) and a memory system 200 and the memory system 200 may include a memory controller 210 and a memory module 400. Here, K and k are integers greater than two, respectively.

The memory module 400 may include a plurality of semiconductor memory devices DRAMs 401a, 402a, . . . , 40ta and 401b, 402b, . . . , 40tb. Here, t is an integer greater than two, and may be greater than, less than, or equal to k.

The memory controller 210 may be connected to the plurality of semiconductor memory devices 401a, 402a, . . . , 40ta and 401b, 402b, . . . , 40tb through a plurality of channels CH1, CH2, . . . , CHt. The plurality of semiconductor memory devices 401a, 402a, . . . , 40ta and 401b, 402b, . . . , 40tb may be divided into, e.g. may be partitioned into, first semiconductor devices and second semiconductor devices belonging to different ranks.

The memory controller 210 may be connected to the plurality of hosts 100a, 100b, . . . , 100k through a bus, such as through a compute express link (CXL) bus 50 and may control the plurality of semiconductor memory devices 401a, 402a, . . . , 40ta and 401b, 402b, . . . , 40tb by communicating the plurality of hosts 100a, 100b, . . . , 100k through the CXL bus 50. The CXL bus 50 may be referred to as a serial interface.

In some example embodiments, the CXL bus 50 may support a plurality of CXL protocols and messages and/or data may be transmitted through the plurality of CXL protocols. For example, the plurality of CXL protocols may include one or more of a non-coherent protocol (or an I/O protocol CXL.io), a coherent protocol (or a cache protocol CXL.cache), and a memory access protocol (or a memory protocol CXL.memory). In some example embodiments, the CXL bus 50 may support protocols such as one or more of peripheral component interconnection (PCI), PCI express (PCIe), universal serial bus (USB), and serial advanced technology attachment (SATA). A protocol supported by the CXL bus 50 may referred to as an interconnect protocol.

When first defective memory cell lines such as first defective memory cell rows, which are unrepairable with an amount of redundancy resources, occur in at least a portion of the plurality of semiconductor memory devices 401a, 402a, ..., 40ta and 401b, 402b, ..., 40ta, the memory controller 210 may allocate a portion of a normal cell array of at least the portion of the plurality of semiconductor memory devices 401a, 402a, ..., 40ta and 401b, 402b, ..., 40tb as a reversed region, and may remap unrepairable addresses of the first defective memory cell rows to consecutive physical addresses of the reserved region in response to at least one of the plurality of hosts 100a, 100b, ..., 100k accessing the first defective memory cell rows. That is, the memory controller 210 may bypass an access first defective memory cell rows by the at least one of the plurality of hosts 100a, 100b, ..., 100k to the reserved region. Here a defective memory cell row may be a row connected to a plurality of cells where writing to and/or reading from the plurality of cells is defective, and the number of defective cells connected to the defective memory cell row is greater than a threshold; the threshold may relate to or correspond to a redundancy resources. Example embodiments are not limited thereto.

The memory controller 210 may include a nonvolatile storage 220, a bad block manager 250 and a remapping engine 300.

The bad block manager 250, in a test mode of the memory module 400, may receive unrepairable address information from each of the plurality of semiconductor memory devices 401a, 402a, ..., 40ta and 401b, 402b, ..., 40tb, which is associated with addresses of the first defective memory cell rows that are unrepairable with a provided redundancy resource from among defective memory cell rows of each of the plurality of semiconductor memory devices 401a, 402a, ..., 40ta and 401b, 402b, ..., 40tb, and may store the unrepairable address information in the nonvolatile storage 220.

The bad block manager 250 may allocate a portion of the normal cell regions of at least one of the plurality of semiconductor memory devices 401a, 402a, ..., 40ta and 401b, 402b, ..., 40tb as a reserved region. The bad block manager 250 may allocate the portion of the normal cell regions of at least some of the plurality of semiconductor memory devices 401a, 402a, ..., 40ta and 401b, 402b, ..., 40tb as the reserved region, for example based on a designated vendor specific extended capability (DVSEC).

The bad block manager 250 may read the unrepairable address information from the nonvolatile storage 220 and may provide the unrepairable address information to the remapping engine 300, for example when the memory system 200 is booted.

The bad block manager 250, in a normal operation on the memory module 400, may remap a first host physical address to a first physical address of the reserved region when the first host physical address for accessing at least one of the plurality of semiconductor memory devices 401a, 402a, ..., 40ta and 401b, 402b, ..., 40tb, from at least one of the plurality of hosts 100a, 100b, ..., 100k matches a first unrepairable address included in the unrepairable address information. For example, the memory controller 210 may bypass a write/read operation on a defective memory cell row designated by the first unrepairable address to a memory cell row designated by the first physical address of the reserved region.

The bad block manager 250, in the normal operation on the memory module 400, may remap a second host physical address to a second physical address of the reserved region when the second host physical address for accessing at least one of the plurality of semiconductor memory devices 401a, 402a, ..., 40ta and 401b, 402b, ..., 40tb, from at least one of the plurality of hosts 100a, 100b, ..., 100k matches a second unrepairable address included in the unrepairable address information. For example, the memory controller 210 may bypass a write/read operation on a defective memory cell row designated by the second unrepairable address to a memory cell row designated by the second physical address of the reserved region. The first physical address and the second physical address are consecutive (e.g., linear). The first physical address and the second physical address may be adjacent physical addresses. A value of the first physical address may be one more, or one less, than a value of the second physical address.

Each of the plurality of hosts 100a, 100b, ..., 100k may drive at least one virtual machine.

The memory controller 210 may refer to a device that provides functions to the plurality hosts 100a, 100b, ..., 100k. Based on a specification such as the CXL specification 2.0, the memory controller 210 may be or may include or be included in an accelerator that supports the CXL specification. For example, at least some of computing operations and I/O operations executed in the plurality hosts 100a, 100b, ..., 100k may be off-loaded to the memory controller 210. In some example embodiments, the each of the plurality hosts 100a, 100b, ..., 100k may include any one or any combination of a programmable component (e.g., a graphic processing unit (GPU) and a neural processing unit (NPU), a component (e.g., an intellectual property (IP) core) that provides a fixed function and a reconfigurable component (e.g., a field programmable gate array (FPGA)).

Figure 2:
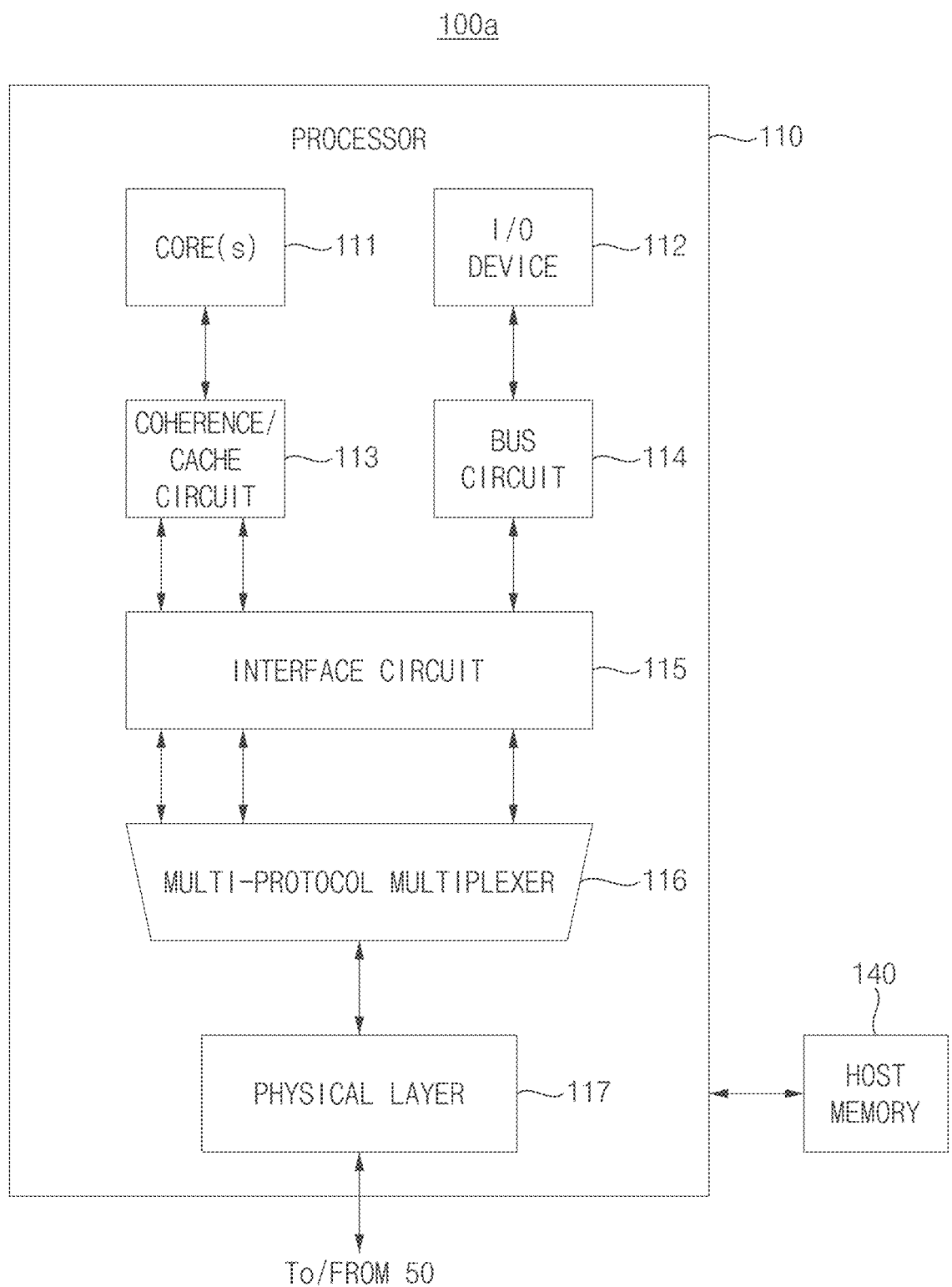
FIG. 2 is a block diagram illustrating one of the plurality hosts in the computing system of FIG. 1 according to various example embodiments.

FIG. 2 is a block diagram illustrating one of the plurality hosts in the computing system of FIG. 1 according to various example embodiments.

In FIG. 2, a configuration of the host 100a from among the plurality hosts 100a, 100b, ..., 100k is illustrated and each configuration of the hosts 100b, ..., 100k may be substantially the same as the configuration of the host 100a.

Referring to FIG. 2, the host 100a may include a processor 110 and a host memory 140.

The processor 110 may be or may include or be included in a central processing unit (CPU) of the host 100a. In some example embodiments, the processor 110 may be, include, or be included in a CXL-based processor. As illustrated in FIG. 2, the processor 110 may be connected to the host memory 140 and may include a physical layer 117, a multi-protocol multiplexer 116, an interface circuit 115, a coherence/cache circuit 113, a bus circuit 114, at least one core 111 and an I/O device 112.

The at least one core 111 may execute an instruction and be connected to the coherence/cache circuit 113. The coherence/cache circuit 113 may include a cache hierarchy and may be referred to as a coherence/cache logic. As illustrated in FIG. 2, the coherence/cache circuit 113 may communicate with the at least one core 111 and interface circuit 115. For example, the coherence/cache circuit 113 may enable communication through at least protocols including a coherent protocol and a memory access protocol. In some example embodiments, the coherence/cache circuit 113 may include a direct memory access (DMA) circuit. The I/O device 112 may be used to communicate with the bus circuit 114. For example, the bus circuit 114 may be a PCIe logic and the I/O device 112 may be a PCIe I/O device.

The interface circuit 115 may enable communication between components (e.g., the coherence/cache circuit 113 and the bus circuit 114) of the processor 110 and the memory system 200. In some example embodiments, the interface circuit 115 may enable communication between components of the processor 110 and the memory system 200 according to a plurality of protocols (e.g., a non-coherent protocol, the coherent protocol and the memory access protocol). For example, the interface circuit 115 may determine one of the plurality of protocols based on messages and data for communication between the components of the processor 110 and the memory system 200.

The multi-protocol multiplexer 116 may include at least one protocol queue. The interface circuit 115 may be connected to the at least one protocol queue and may transmit and/or receive messages and/or data to and from the memory system 200 through the least one protocol queue. In some example embodiments, the interface circuit 115 and the multi-protocol multiplexer 116 may be integrally formed into one component. In some example embodiments, the multi-protocol multiplexer 116 may include a plurality of protocol queues corresponding respectively to the plurality of protocols supported by the CXL bus 50. In some example embodiments, the multi-protocol multiplexer 116 may arbitrate communications of different protocols and provide selected communications the physical layer 117.

Figure 3:
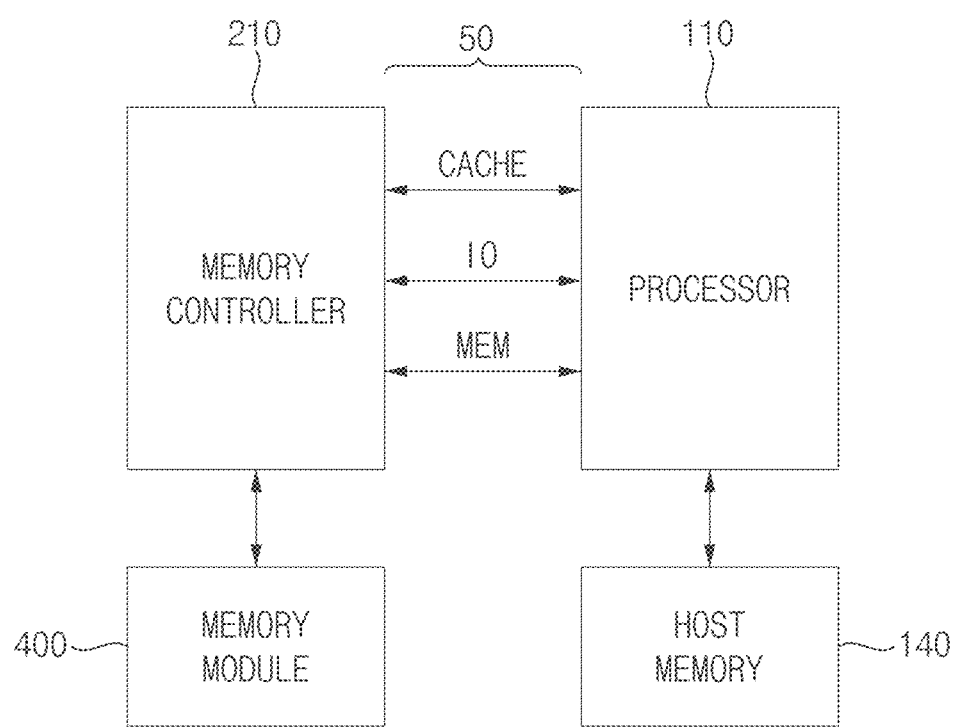
FIG. 3 illustrates an example of a multi-protocol for communication in the computing system of FIG. 1.

FIG. 3 illustrates an example of a multi-protocol for communication in the computing system of FIG. 1.

Referring to FIG. 3, the processor 110 and the memory controller 210 may communicate with each other based on a plurality of protocols.

According to the above-mentioned CXL examples, the plurality of protocols may include a memory protocol MEM, a coherent protocol CACHE and a non-coherent protocol IO. The memory protocol MEM may define a transaction from a master to a subordinate and a transaction from the subordinate to the master. The coherent protocol CACHE may define interactions between the memory controller 210 and the processor 110. For example, an interface of the coherent protocol CACHE may include three channels including a request, a response and data. The non-coherent protocol IO may provide a non-coherent load/store for I/O devices.

The memory controller 210 may communicate with the memory module 400, and the processor 110 may communicate with the host memory 140.

Figure 4:
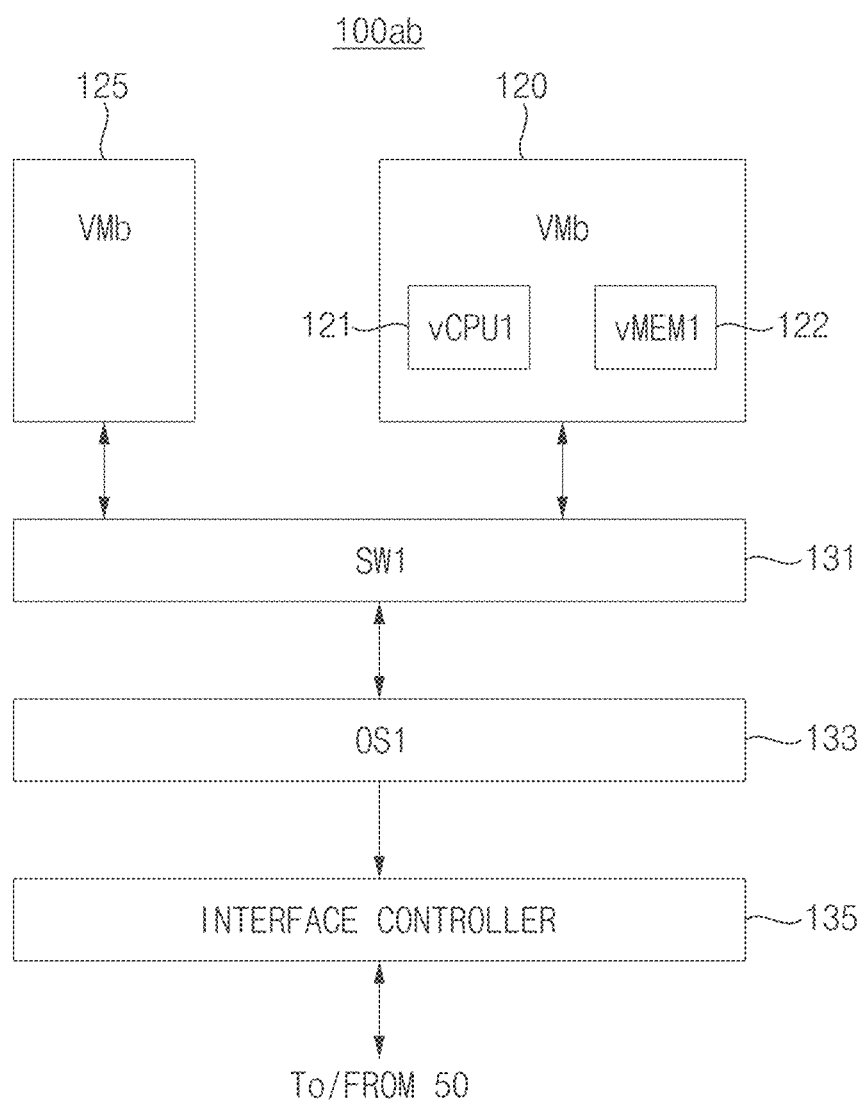
FIG. 4 is a block diagram illustrating one of the plurality hosts in the computing system of FIG. 1 according to various example embodiments.

FIG. 4 is a block diagram illustrating one of the plurality hosts in the computing system of FIG. 1 according to various example embodiments.

In FIG. 4, a configuration of the host 100*ab* corresponding to the host 100*a* from among the plurality hosts 100*a*, 100*b*, . . . , 100*k* is illustrated and each configuration of the hosts 100*b*, . . . , 100*k* may be substantially the same as the configuration of the host 100*ab*.

Referring to FIG. 4, the host 400*ab* may include a first operating system OS1 133, a plurality of virtual machines VMa 120 and VMb 125, a first switch SW1 131 and an interface controller 135. The first operating system 133 may be driven on the host 100*ab* and may control or manage overall operations of the host 100*ab*.

The plurality of virtual machine 120 and 125 may be or may include or be included in a virtual system that is driven on the first operating system 133. The plurality of virtual machine 120 and 125 may drive independent or individual operating systems, respectively. For example, the virtual machine 120 may include a first virtual CPU vCPU1 121 and a first virtual memory vMEM1 122.

The first virtual CPU 121 may be configured to perform various operations that are driven by the first virtual machine 120. The first virtual memory 122 may be configured to store data that are used or generated at the virtual machine 120.

A structure of the virtual machine 125 may be similar with the structure of the virtual machine 120, and thus detailed description on the virtual machine 125 will be omitted.

The first switch 131 may be configured to perform one or more functions of arbitrating, switching, or routing various communication requests or various communication packets. The first switch 131 may be or may correspond to a physical switch or a virtual switch. The first switch 131 may perform one or more functions of arbitrating, switching, or routing various communication between various components (e.g., virtual machines) included in the host 100*ab* and/or communications between the hosts.

The interface controller 135 may be, include, or be included in an interface circuit configured to support heterogeneous computing interface such as a CXL interface. In some example embodiments, the heterogeneous computing interface may be interface complying with the CXK protocol, but example embodiments are not limited thereto. For example, the heterogeneous computing interface may be implemented based on at least one of various computing interfaces Gen-Z protocol, an NVLink protocol, a CCIX protocol, and an Open CAPI protocol.

Figure 5:
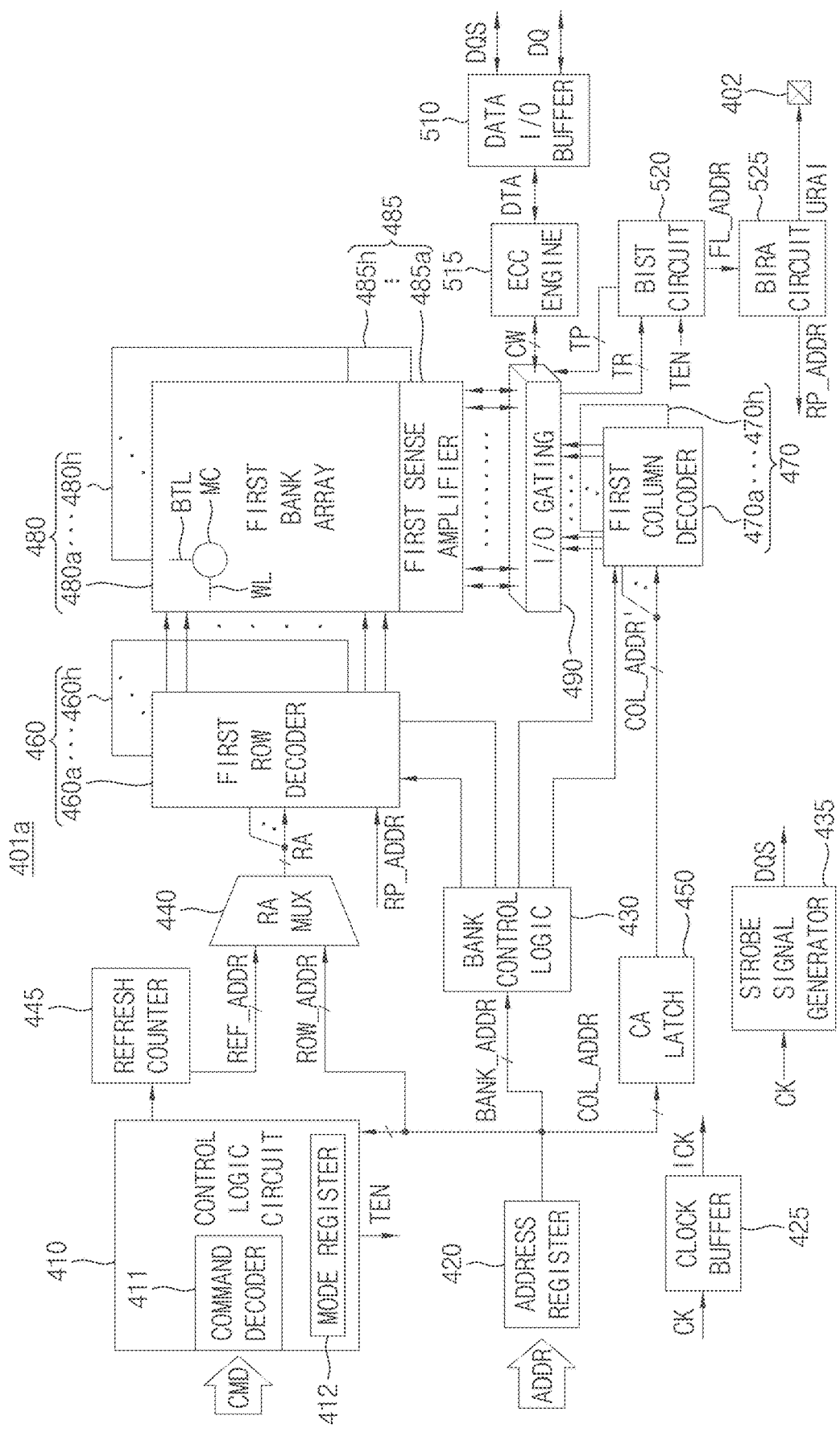
FIG. 5 is a block diagram illustrating an example one of the semiconductor memory devices in the computing system of FIG. 1 according to various example embodiments.

FIG. 5 is a block diagram illustrating an example one of the semiconductor memory devices in the computing system of FIG. 1 according to various example embodiments.

In FIG. 5, a configuration of the semiconductor memory device 401*a* from among the plurality of semiconductor memory devices 401*a*, 402*a*, . . . , 40*ta* and 401*b*, 402*b*, . . . , 40*tb* is illustrated, and a configuration of each of the plurality of semiconductor memory devices 402*a*, . . . , 40*ta* and 401*b*, 402*b*, . . . , 40*tb* may be substantially the same as the configuration of the semiconductor memory device 401*a*.

Referring to FIG. 5, the semiconductor memory device 401*a* may include a control logic circuit 410, an address register 420, a clock buffer 425, a bank control logic 430, a strobe signal generator 435, a refresh counter 445, a row address multiplexer 440, a column address latch 450, a row decoder 460, a column decoder 470, a memory cell array 480, a sense amplifier unit 485, an I/O gating circuit 490, an error correction code (ECC) engine 515, a data I/O buffer 510, a built-in self-test (BIST) circuit 520 and a built-in redundancy analysis (BIRA) circuit 525.

For example, the semiconductor memory device 401*a* may be or may include or be included in a volatile memory device based on synchronous dynamic random access memory (SDRAM) device.

The memory cell array 480 includes a plurality of bank arrays, such as first through eighth bank arrays 480*a*~480*h*. The row decoder 460 includes a corresponding plurality of row decoders, such as first through eighth bank row decoders 460*a*~460*h* respectively coupled to the first through eighth bank arrays 480*a*~480*h*, the column decoder 470 includes a corresponding plurality of column decoders, such as first through eighth bank column decoders 470*a*~470*h* respectively coupled to the first through eighth bank arrays 480*a*~480*h*, and the sense amplifier unit 485 includes a corresponding plurality of bank sense amplifiers, such as first through eighth bank sense amplifiers 485*a*~485*h* respectively coupled to the first through eighth bank arrays 480*a*~480*h*.

The first through eighth bank arrays 480*a*~480*h*, the first through eighth bank row decoders 460*a*~460*h*, the first through eighth bank column decoders 470*a*~470*h* and first through eighth bank sense amplifiers 485*a*~485*h* may form first through eighth banks. Each of the first through eighth bank arrays 480*a*~480*h* may include a plurality of memory cells MC formed at intersections of a plurality of word-lines WL and a plurality of bit-line BTL.

The address register 420 may receive the address ADDR including a bank address BANK_ADDR, a row address ROW_ADDR and a column address COL_ADDR from the memory controller 210. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the first through eighth bank row decoders 460a~460h corresponding to the bank address BANK_ADDR is activated in response to the bank control signals, and one of the first through eighth bank column decoders 470a~470h corresponding to the bank address BANK_ADDR is activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 is applied to the first through eighth bank row decoders 460a~460h.

The refresh counter 445 may sequentially increase or decrease the refresh row address REF_ADDR and may output the refresh row address REF_ADDR under control of the control logic circuit 410.

The one of the first through eighth bank row decoders 460a~460h that is activated by the bank control logic 430 may decode the row address RA that is output from the row address multiplexer 440, and may activate a word-line corresponding to the row address RA. For example, the activated bank row decoder applies a word-line driving voltage to the word-line corresponding to the row address.

The column address latch 450 may receive the column address COL_ADDR from the address register 420, and may temporarily store the received column address COL_ADDR. In some example embodiments, in a burst mode, the column address latch 450 generates column addresses COL_ADDR' that increment from the received column address COL_ADDR. The column address latch 450 may apply the temporarily stored column address COL_ADDR or generated column address COL_ADDR' to the first through eighth bank column decoders 470a~470h.

The activated one of the first through eighth bank column decoders 470a~470h may activate a sense amplifier corresponding to the bank address BANK_ADDR and the column address COL_ADDR through the I/O gating circuit 490.

The I/O gating circuit 490 may include a circuitry for gating input/output data, and further includes input data mask logic, read data latches for storing data that is output from the first through eighth bank arrays 480a~480h, and write drivers for writing data to the first through eighth bank arrays 480a~480h.

A codeword CW read from one bank array of the first through eighth bank arrays 480a~480h may be sensed by a sense amplifier coupled to the one bank array from which the data is to be read, and may be stored in the read data latches. The codeword CW stored in the read data latches may be provided to the ECC engine 515, the ECC engine 515 may generate data DTA by performing an ECC decoding on the codeword CW to provide the data DTA to the data I/O buffer 510, the data I/O buffer 510 may convert the data DTA to data signal DQ and the data I/O buffer 520 may transmit the data signal DQ with a data strobe signal DQS to the memory controller 210.

The data signal DQ to be written in a selected one bank array of the first through eighth bank arrays 480a~480h may be provided to the data I/O buffer 510 from the memory controller 210. The data I/O buffer 510 may convert the data signal DQ to the data DTA and may provide the data DTA to the ECC engine 515. The ECC engine 515 may perform ECC encoding on the data DTA to generate parity bits, and may provide the codeword CW including the data DTA and the parity bits to the I/O gating circuit 490. The I/O gating circuit 490 may write the codeword CW in a sub-page in the selected one bank array through the write drivers.

The data I/O buffer 510 may provide the data signal DQ from the memory controller 210 to the ECC engine 515 by converting the data signal DQ to the data DTA in a write operation of the semiconductor memory device 401a, and may convert the data DTA to the data signal DQ from the ECC engine 515 and may transmit the data signal DQ and the data strobe signal DQS to the memory controller 210 in a read operation of the semiconductor memory device 401a.

The ECC engine 515 may perform an ECC encoding and an ECC decoding on the DTA according to a control of the control logic circuit 410.

The clock buffer 425 may receive the clock signal CK, may generate an internal clock signal ICK by buffering the clock signal CK, and may provide the internal clock signal ICK to circuit components processing the command CMD and the address ADDR.

The strobe signal generator 435 may receive the clock signal CK, may generate the data strobe signal DQS based on the clock signal CK and may provide the data strobe signal DQS to the data I/O buffer 510.

The BIST circuit 520 may perform a test on a plurality of (volatile) memory cells in the memory cell array 480 in a test mode that is enabled based on a test enable signal TEN. The BIST circuit 520, in the test mode, may write test pattern data TP in the plurality of memory cells in the memory cell array 480, may receive test result data TR responding to the test pattern data TP from the plurality of memory cells in the memory cell array 480, and may determine each of the plurality of memory cells has a defect based on a comparison of the test pattern data TP and the test result data TR.

The BIST circuit 520 may provide the BIRA circuit 525 with defective addresses FL_ADDR of addresses of defective memory cell rows and each of the defective memory cell rows from among a plurality of memory cell rows in the memory cell array 480 includes defective memory cells equal to a greater than a reference value.

The BIRA circuit 525 may receive the defective addresses FL_ADDR and may provide an address of at least a first defective memory cell row, where the number of defect cells connected to the first defective memory cell row exceeds the redundancy resource, from among the defective memory cell rows designated by the defective addresses FL_ADDR as unrepairable address information URI to the memory controller 210 through a pin 402 based on the redundancy resource of the memory cell array 480.

Alternatively or additionally, the BIRA circuit 525 may receive the defective addresses FL_ADDR and may provide a repair address RP_ADDR replacing at least a first defective memory cell row, has fewer defective memory cells connected to the row than the corresponding redundancy resource, from among the defective memory cell rows designated by the defective addresses FL_ADDR to the row decoder 460 based on the redundancy resource of the memory cell array 480.

The control logic circuit 410 may control operations of the semiconductor memory device 401a. For example, the control logic circuit 410 may generate control signals for the semiconductor memory device 401a in order to perform a write operation and/or a read operation. The control logic circuit 410 may include a command decoder 411 that decodes the command CMD received from the memory controller 210 and a mode register 412 that sets an operation mode of the semiconductor memory device 401a.

For example, the command decoder 411 may generate the control signals corresponding to the command CMD by decoding one or more of a write enable signal, a row address strobe signal, a column address strobe signal, a chip select signal, etc. For example, the command decoder 411 may generate the test enable signal TEN when the command CMD designates the test mode and may provide the test enable signal TEN to the BIST circuit 520.

Figure 6:
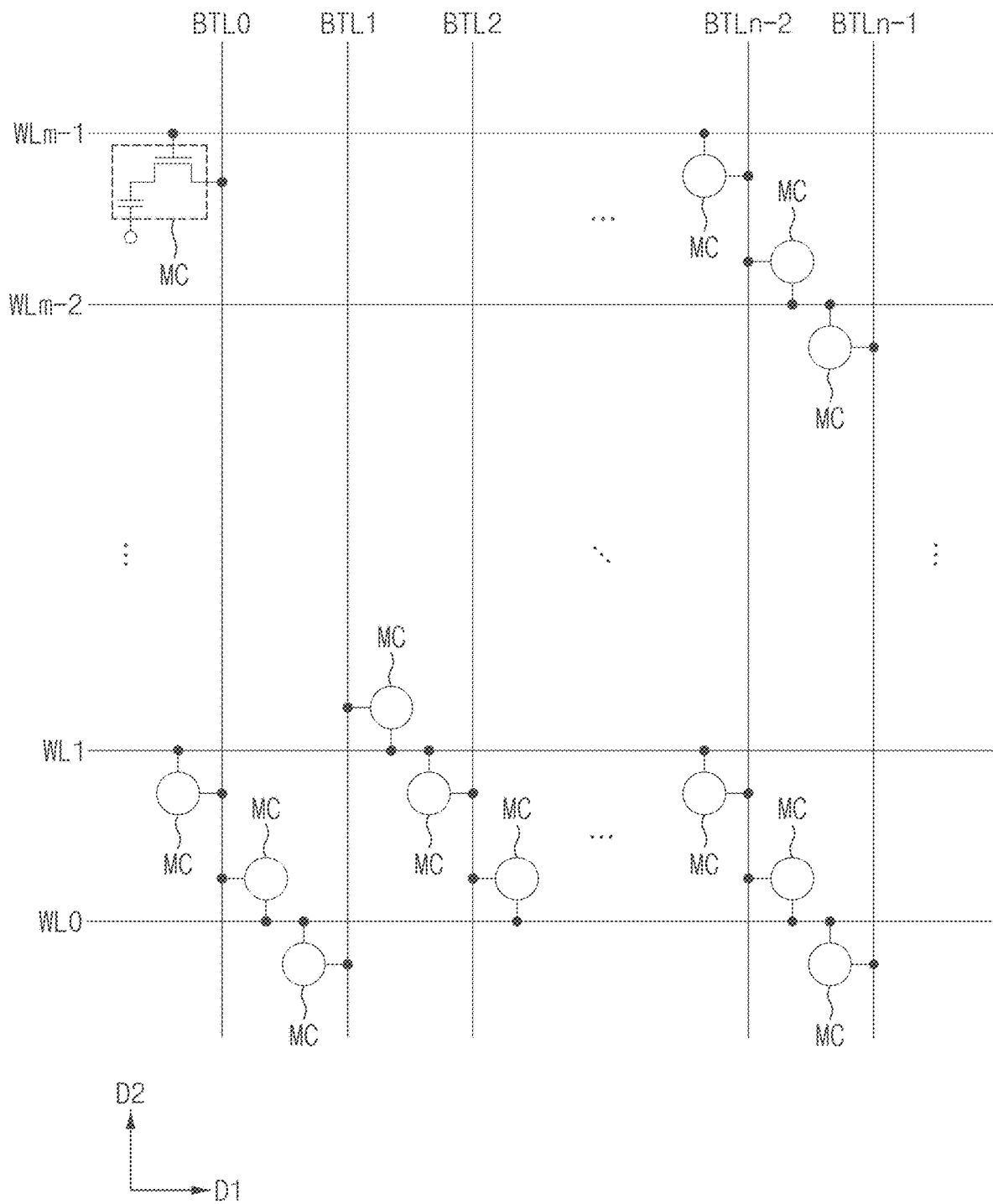
FIG. 6 illustrates an example of the first bank array in the semiconductor memory device of FIG. 5.

FIG. 6 illustrates an example of the first bank array in the semiconductor memory device of FIG. 5.

Referring to FIG. 6, the first bank array 480a may include a plurality of word-lines WL~WLm−1 (where m is an even number equal to or greater than two), a plurality of bit-lines BTL0~BTLn−1 (where n is an even number equal to or greater than two), and a plurality of memory cells MCs disposed at intersections between the word-lines WL0~WLm−1 and the bit-lines BTL0~BTLn−1. In some example embodiments, m is greater than n; in some example embodiments, m equals n; and in some example embodiments, m is less than n. In some example embodiments, the plurality of word-lines WL~WLm−1 may correspond to a plurality of rows, and the plurality of bit-lines BTL0~BTLn−1 may correspond to a plurality of columns.

The word-lines WL~WLm−1 may extend in a first direction D1 and the bit-lines BTL0~BTLn−1 may extend in a second direction D2 crossing the first direction D1.

Each of the memory cells MCs includes an access (cell) transistor coupled to one of the word-lines WL0~WLm−1 and one of the bit-lines BTL0~BTLn−1 and a storage (cell) memory element such as a storage cell capacitor coupled to the cell transistor. For example, each of the memory cells MCs has a DRAM cell structure.

In addition, the memory cells MCs may have different arrangement depending on that the memory cells MCs are coupled to an even word-line (for example, WL0) or an odd word-line (for example, WL1). For example, a bit-line coupled to adjacent memory cells may be different depending on whether a word-line selected by an access address is an even word-line or an odd word-line. However, example embodiments are not limited thereto. The memory cells MCs coupled to the even word-line (for example, WL0) and the odd word-line (for example, WL1) may have the same arrangement.

Figure 7:
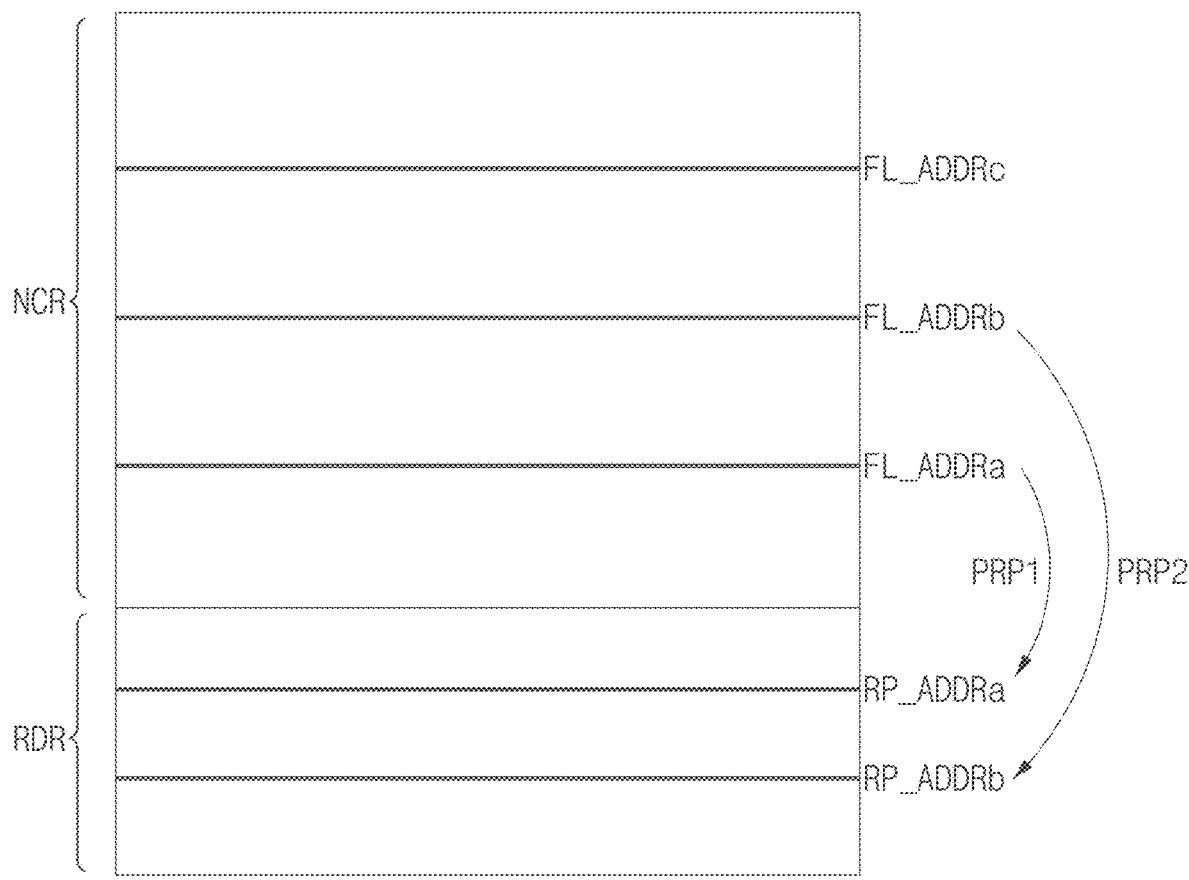
FIG. 7 illustrates an example of the memory cell array in the semiconductor memory device of FIG. 5.

FIG. 7 illustrates an example of the memory cell array in the semiconductor memory device of FIG. 5.

Referring to FIG. 7, the memory cell array 480 may include a normal cell region NCR and a redundancy (cell) region RDR.

The redundancy region RDR may be or may correspond to a region of replacing defective memory cells in the normal cell region NCR, a defective memory cell row designated by a defective address FL_ADDRa, in the normal cell region NCR may be replaced with a redundancy memory cell row RPR1 designated by a repair address RP_ADDRa, in the redundancy region RDR, and a defective memory cell row designated by a defective address FL_ADDRb, in the normal cell region NCR may be replaced with a redundancy memory cell row RPR2 designated by a repair address RP_ADDRb, in the redundancy region RDR.

When a defective memory cell row designated by a defective address FL_ADDRc, which exceeds a redundancy resource of the redundancy region RDR (e.g., which cannot be replaced with redundancy memory cell rows in the redundancy region RDR) in the normal cell region NCR, a semiconductor memory device including the memory cell array 480 cannot be used and thus a memory module including the semiconductor memory device cannot be used.

However, the memory controller 210 may increase usability of the memory module by allocating a portion of the normal cell region NCR as a reserved region and by remapping at least one unrepairable address, which exceeds the redundancy resource of the redundancy region RDR, of the normal cell region NCR to at least one physical address of the reserved region.

Figure 8:
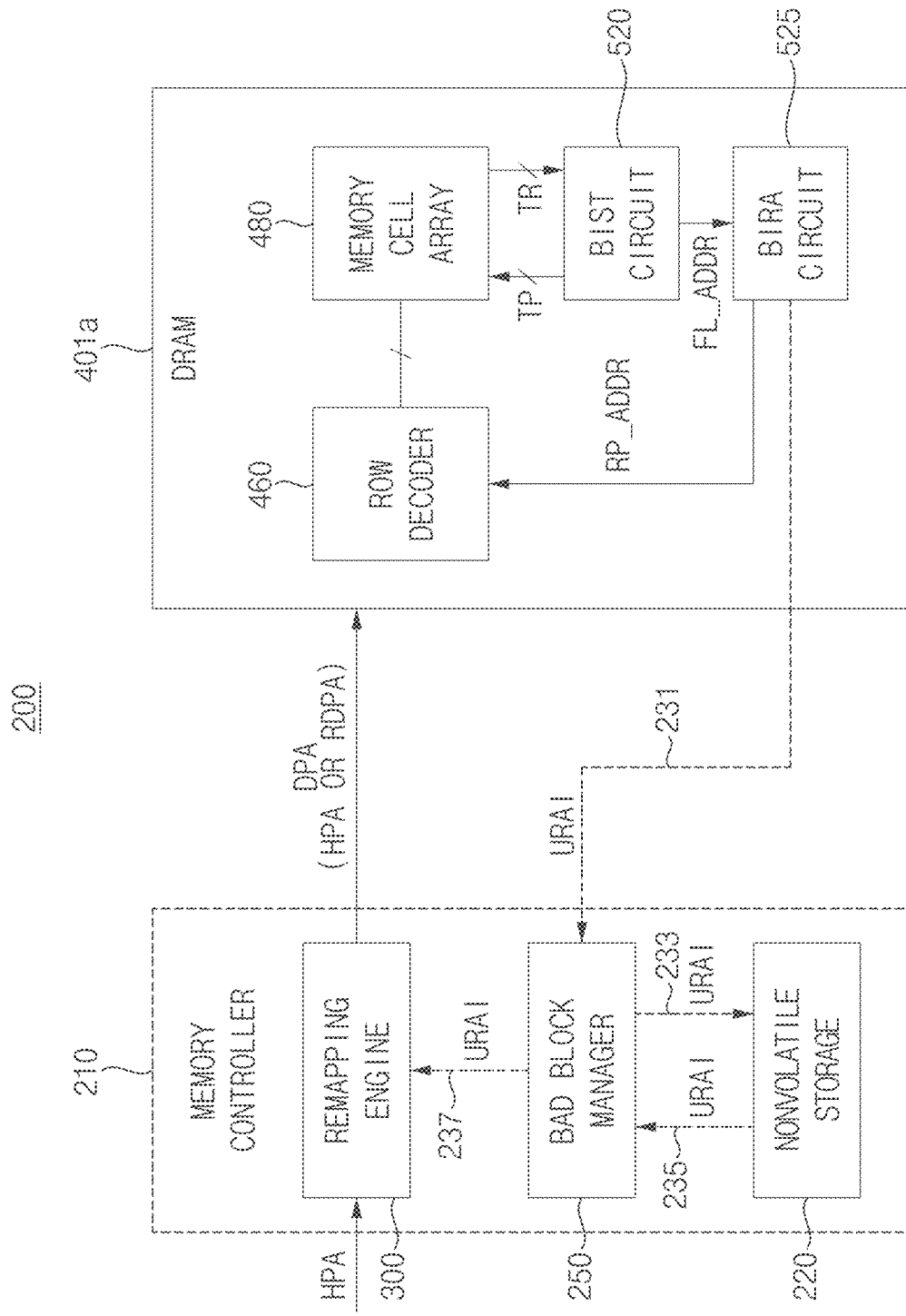
FIG. 8 illustrates a block diagram illustrating the memory controller and one of the plurality of semiconductor memory devices in the memory system in FIG. 1 according to various example embodiments.

FIG. 8 illustrates a block diagram illustrating the memory controller and one of the plurality of semiconductor memory devices in the memory system in FIG. 1 according to various example embodiments.

Referring to FIG. 8, the memory system 200 may include the memory controller 210 and the semiconductor memory device 401a denoted as a DRAM.

The memory controller 210 may include the nonvolatile storage 220, the bad block manager 250, and the remapping engine 300. The semiconductor memory device 401a may include the row decoder 460, the memory cell array 480, the BIST circuit 520, and the BIRA circuit 525. In FIG. 8, the semiconductor memory device 401a is illustrated to include the row decoder 460, the memory cell array 480, the BIST circuit 520 and the BIRA circuit 525 for convenience of explanation.

As mentioned above, the memory cell array 480 may include the normal cell region and the redundancy region. The BIST circuit 520 may perform a test on the plurality of memory cells in the memory cell array 480 in the test mode based on the test enable signal TEN, and based on comparison on the test pattern data TP and the test result data TR read from the memory cell array 480, the BIS circuit 520 may provide the BIRA circuit 525 with the defective addresses FL_ADDR of addresses of defective memory cell rows. Each of the defective memory cell rows from among the plurality of memory cell rows in the memory cell array 480 includes defective memory cells equal to a greater than a reference value.

The BIRA circuit 525 may receive the defective addresses FL_ADDR and may provide an address of at least a first defective memory cell row, wherein the number of defective cells connected thereto exceeds the redundancy resource, from among the defective memory cell rows designated by the defective addresses FL_ADDR as the unrepairable address information URAI to the memory controller 210, based on the redundancy resource of the memory cell array 480.

Alternatively or additionally, the BIRA circuit 525 may receive the defective addresses FL_ADDR and may provide a repair address RP_ADDR replacing at least a first defective memory cell row, which is within the redundancy resource, from among the defective memory cell rows designated by the defective addresses FL_ADDR to the row decoder 460 based on the redundancy resource of the memory cell array 480.

The bad block manager 250, in the test mode of the memory module 400, may receive the unrepairable address information URAI from the BIRA circuit 525 as indicated by a reference numeral 231, and may store the unrepairable address information URAI in the nonvolatile storage 220 as indicated by a reference numeral 233. The bad block manager 250 may allocate a portion of the normal cell region of the semiconductor memory device 401*a* as a reserved region based on the unrepairable address information URAI. When the memory system 200 is booted or powered on, the bad block manager 250 may read the unrepairable address information URAI from the nonvolatile storage 220 as indicated by a reference numeral 235 and may provide the unrepairable address information URAI to the remapping engine 300 as indicated by a reference numeral 237.

The bad block manager 250, in the normal operation, may provide the semiconductor memory device 401*a* with one of a host physical address HPA and a physical address RDPA to replace the unrepairable address as a device physical address DPA based on whether the host physical address HPA for accessing the memory cell array 480, from at least one of the plurality of hosts 100*a*, 100*b*, . . . , 100*k* matches one of the plurality of unrepairable addresses.

When the host physical address HPA does not match respective one of the plurality of unrepairable addresses, the bad block manager 250 may provide the semiconductor memory device 401*a* with the host physical address HPA as the device physical address DPA. When the host physical address HPA matches one of the plurality of unrepairable addresses, the bad block manager 250 may provide the semiconductor memory device 401*a* with the physical address RDPA to replace the unrepairable address as the device physical address DPA.

Figures 9, 10:
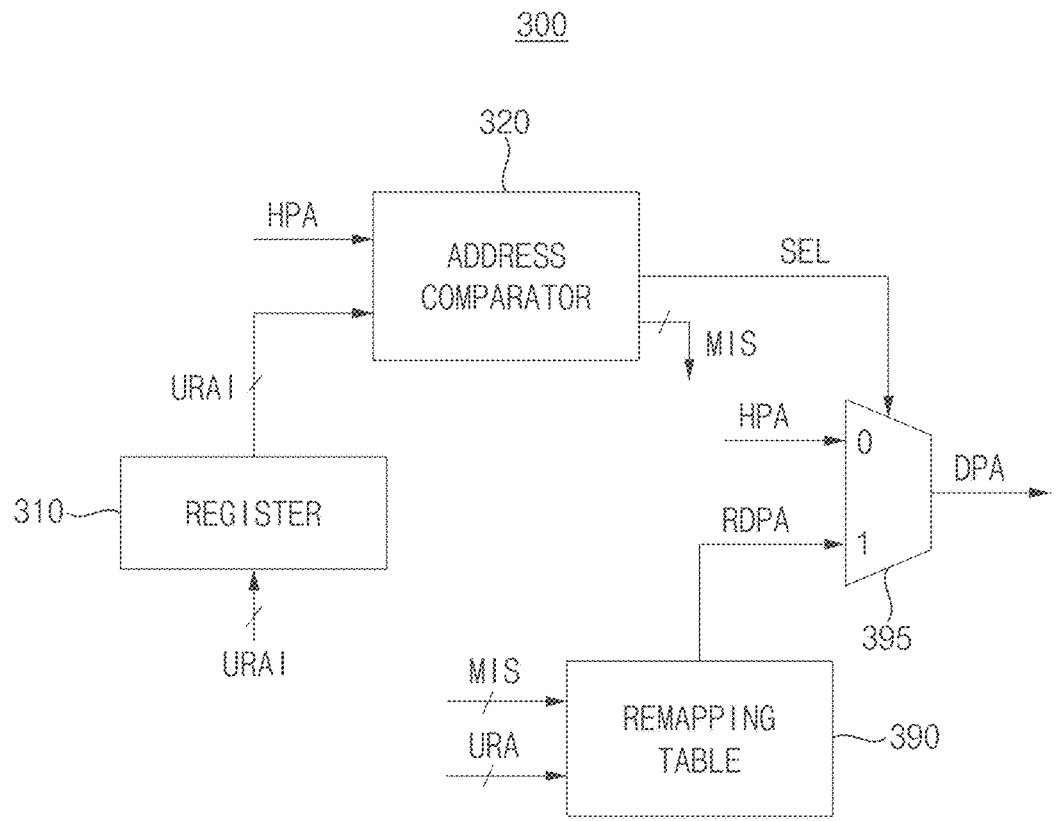
FIG. 9 is a block diagram illustrating an example of the remapping engine in the memory controller in FIG. 8 according to various example embodiments.
FIG. 10 illustrates an example of the remapping table in the remapping engine of FIG. 9 according to various example embodiments.

FIG. 9 is a block diagram illustrating an example of the remapping engine in the memory controller in FIG. 8 according to various example embodiments.

Referring to FIG. 9, the remapping engine 300 may include a register 310, an address comparator 320, a remapping table 390, and a multiplexer 395.

The register 310 may store the unrepairable address information URAI.

The address comparator 320 may generate a selection signal SEL and a matching information signal MIS by comparing the host physical address HPA with each of a plurality of unrepairable addresses included in the unrepairable address information URAI. The selection signal SEL may indicate whether the host physical address HPA matches one of the plurality of unrepairable addresses, and the matching information signal MIS may designate a target unrepairable address, which matches the host physical address HPA, from among the plurality of unrepairable addresses.

The remapping table 390 may store mapping relationship between a plurality of unrepairable addresses URA and physical addresses of the reserved region corresponding to the plurality of unrepairable addresses URA, and may output a target physical address RDPA mapped to a target unrepairable address based on the matching information signal MIS.

The multiplexer 395 may output one of the host physical address HPA and the target physical address RDPA as the device physical address DPA based on the selection signal SEL.

For example, the multiplexer 395 may output the target physical address RDPA as the device physical address DPA in response to the selection signal SEL indicating that the host physical address HPA matches one of the plurality of unrepairable addresses URA. For example, the multiplexer 395 may output the host physical address HPA as the device physical address DPA in response to the selection signal SEL indicating that the host physical address HPA does not match respective one of the plurality of unrepairable addresses URA.

FIG. 10 illustrates an example of the remapping table in the remapping engine of FIG. 9 according to various example embodiments.

Referring to FIG. 10, the remapping table 390 may include a first column 391 and a second column 393. The first column 391 may store unrepairable addresses URA1, URA2, . . . , URAr of the plurality of semiconductor memory devices 401*a*, 402*a*, . . . , 40*ta* and 401*b*, 402*b*, . . . , 40*tb* and the second column 393 may store physical addresses RDPA1, RDPA2, . . . , RDPAr of the reserved region, corresponding to the unrepairable addresses URA1, URA2, . . . , URAr. Here, r is an integer greater than two.

Figure 11:
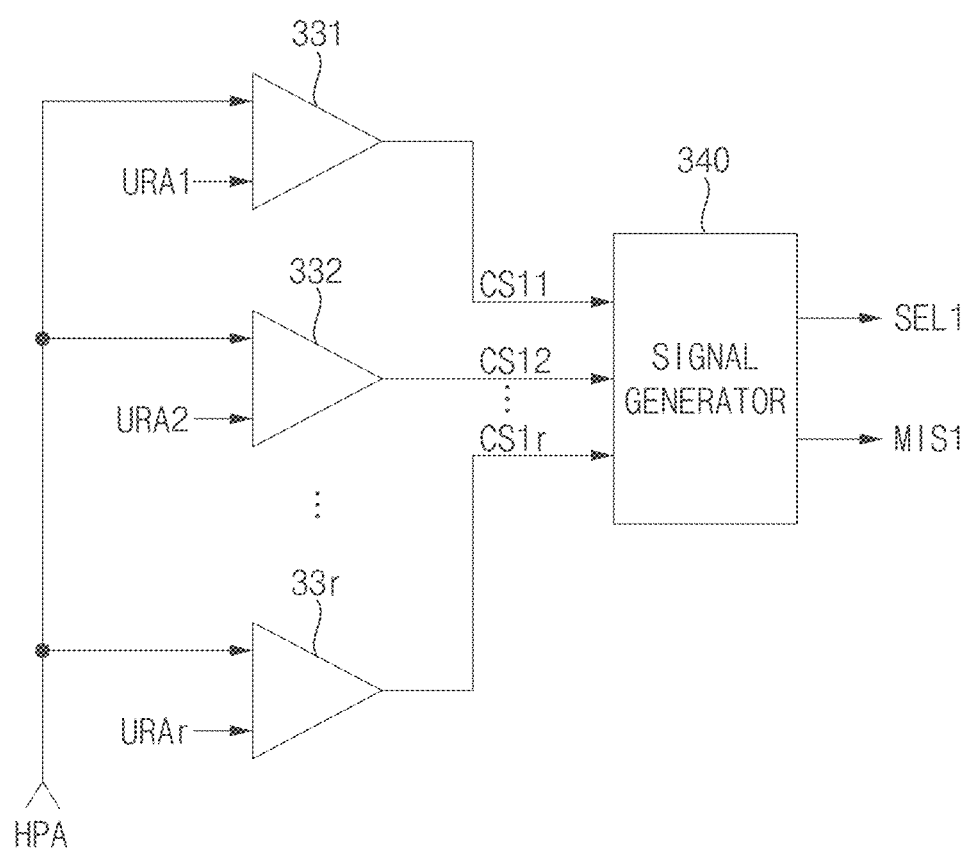
FIG. 11 is a block diagram illustrating an example of the address comparator in remapping engine of FIG. 9 according to various example embodiments.

FIG. 11 is a block diagram illustrating an example of the address comparator in remapping engine of FIG. 9 according to various example embodiments.

Referring to FIG. 11, an address comparator 320*a* may include a plurality of comparators 331, 332, . . . , 33*r* and a signal generator 340.

Each of the plurality of comparators 331, 332, . . . , 33*r* may generate a respective one of a plurality of comparison signals CS1, CS2, . . . , CSr by comparing the host physical address HPA with respective one of the plurality of unrepairable addresses URA1, URA2, . . . , URAr.

The signal generator 340 may generate a selection signal SEL1 and a matching information signal MIS1 based on the plurality of comparison signals CS1, CS2, . . . , CSr.

When one of the plurality of comparison signals CS1, CS2, . . . , CSr indicates that the host physical address HPA matches one of the plurality of unrepairable addresses URA1, URA2, . . . , URAr, the signal generator 340 may generate the selection signal SEL1 for example with a logic high level and may generate the matching information signal MIS1 indicating a matched unrepairable address from among the plurality of unrepairable addresses URA1, URA2, . . . , URAr.

When the plurality of comparison signals CS1, CS2, . . . , CSr indicate that the host physical address HPA does not match respective one of the plurality of unrepairable addresses URA1, URA2, . . . , URAr, the signal generator 340 may generate the selection signal SEL1 for example with a logic low level and may generate the matching information signal MIS1 including a plurality of bits having a logic low level.

Figures 12, 13, 14:
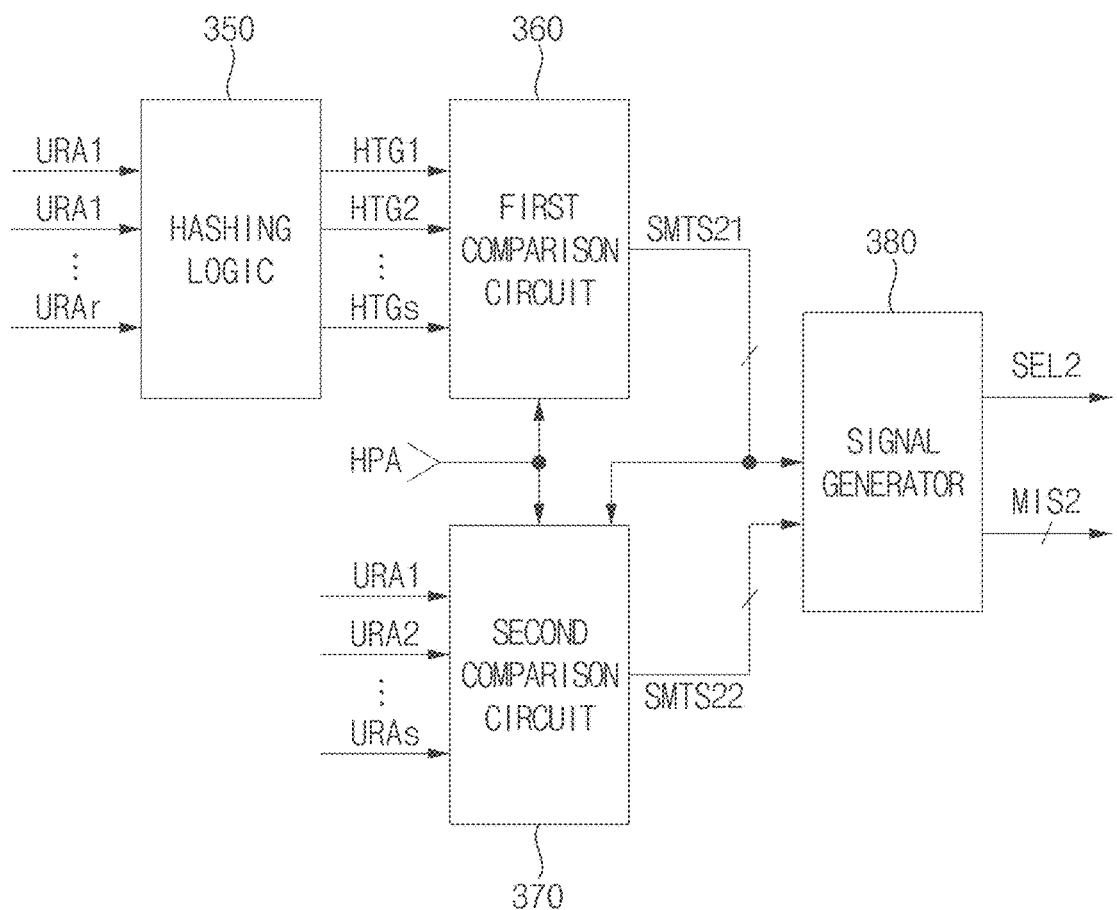
FIG. 12 is a block diagram illustrating an example of the address comparator in remapping engine of FIG. 9 according to various example embodiments.
FIG. 13 illustrates an example configuration of the unrepairable address or the host physical address in FIG. 12 according to various example embodiments.
FIG. 14 illustrates an example configuration of the hash tag in FIG. 12 according to various example embodiments.

FIG. 12 is a block diagram illustrating an example of the address comparator in remapping engine of FIG. 9 according to various example embodiments.

Referring to FIG. 12, an address comparator 320*b* may include a hashing logic 350, a first comparison circuit 360, a second comparison circuit 370 and a signal generator 380.

The hashing logic 350 may generate a plurality of hash strings or hash tags HTG1, HTG2, . . . , HTGs by hashing first bits of each of the plurality of unrepairable addresses URA1, URA2, . . . , URAr. Here, s is a natural number smaller than r and greater than or equal to one.

The first comparison circuit 360 may generate a first sub matching signal SMTS21 indicating a hash tag that matches the first bits of the host physical address HPA by comparing the first bits of the host physical address HPA and the plurality of hash tags HTG1, HTG2, . . . , HTGs.

The second comparison circuit 370 may generate a second sub matching signal SMTS22 by comparing second bits of the host physical address HPA and second bits of each of candidate unrepairable addresses URA1, URA2, . . . , URAs which have hash tags matching the first bits of the host physical address HPA, from among the plurality of unrepairable addresses URA1, URA2, ..., URAr.

The signal generator 380 may generate a selection signal SEL2 and a matching information signal MIS2 based on the first sub matching signal SMTS21 and the second sub matching signal SMTS22. The selection signal SEL2 may indicate whether the host physical address HPA matches one of the plurality of unrepairable addresses URA1, URA2, ..., URAr and the matching information signal MIS2 may indicate a matched unrepairable address from among the plurality of unrepairable addresses URA1, URA2, ..., URAr.

When the first sub matching signal SMTS21 indicates that the first bits of the host physical address HPA do not match respective one of the plurality of hash tags HTG1, HTG2, ..., HTGs, the signal generator 380 may generate the selection signal SEL2 indicating that the host physical address HPA does not match respective one of the plurality of unrepairable addresses URA1, URA2, ..., URAr. For example, the signal generator 380 may generate the selection signal SEL2 with a logic low level.

When the first sub matching signal SMTS21 indicates that the first bits of the host physical address HPA match at least one of the plurality of hash tags HTG1, HTG2, ..., HTGs, the signal generator 380 may generate the selection signal SEL2 indicating that the host physical address HPA matches at least one of the plurality of unrepairable addresses URA1, URA2, ..., URAr. For example, the signal generator 380 may generate the selection signal SEL2 with a logic high level.

FIG. 13 illustrates an example configuration of the unrepairable address or the host physical address in FIG. 12 according to various example embodiments.

Referring to FIG. 13, the unrepairable address URA and/or the host physical address HPA may include a row address RA, a column address CA, a bank address BA, a bank group address BGA, a chip selection signal CS, and a chip identity bit CID. In some example embodiments, each of the row address RA, the column address CA, the bank address BA, the bank group address BGA, and the chip identity bit CID may include a plurality of bits and the chip selection signal CS may include a single bit. The chip selection signal CS may identity a rank of the plurality of semiconductor memory devices 401a, 402a, ..., 40ta and 401b, 402b, ..., 40tb in FIG. 1.

FIG. 14 illustrates an example configuration of the hash tag in FIG. 12 according to various example embodiments.

Referring to FIG. 14, a hash tag HTG may be obtained by including the bank address BA, the chip selection signal CS and the chip identity bit CID from the unrepairable address URA. For example, the bank address BA, the chip selection signal CS and the chip identity bit CID from the unrepairable address URA may correspond to first bits of the unrepairable address URA.

FIG. 15 illustrates an example that the hashing logic generates the hash tags based on the unrepairable addresses in FIG. 12 according to various example embodiments.

In FIG. 15, assuming that each of different unrepairable addresses URA1, URA2, URA3 and URA4 includes chip identity bit CID including bits CID0 and CID1, the row address RA including bits RA12~RA0, the chip selection signal CS including a bit CS0, the bank address BA including bits BA1~BA0, and the column address CA including bits CA8~CA0.

As an example, the hash tag HTG constituted by or included in the bank address BA, the chip selection signal CS, and the chip identity bit CID of each of the unrepairable addresses URA1, URA2, URA3, and URA4 corresponds to '00111000', '00101011', '01111101' and '01111101', respectively and the hash tag HTG of the unrepairable address URA3 is the same as the hash tag HTG of the unrepairable address URA4.

When the address comparator 320 in FIG. 9 employs the hashing logic, the hashing logic may quickly search the unrepairable address that matches the host physical address HPA even though a number of the unrepairable addresses is great.

Figure 16:
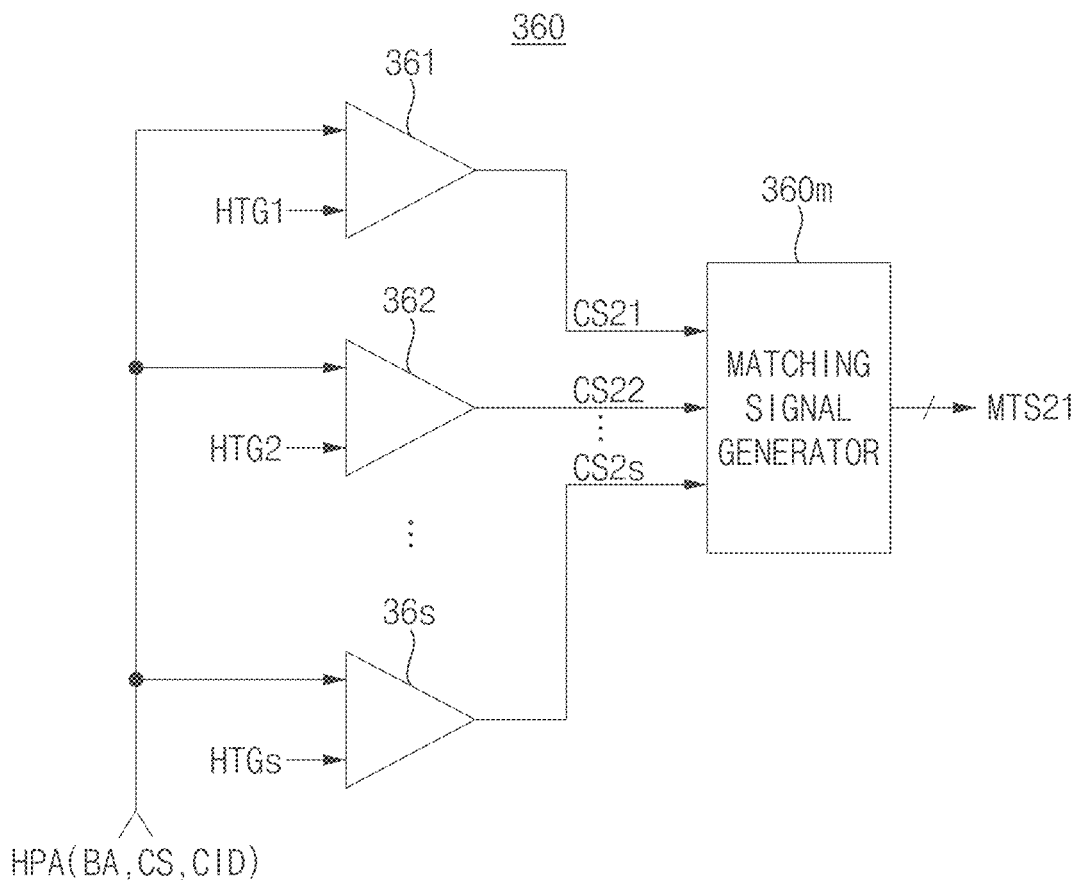
FIG. 16 is a circuit diagram illustrating an example of the first comparison circuit in the address comparator of FIG. 12 according to various example embodiments.

FIG. 16 is a circuit diagram illustrating an example of the first comparison circuit in the address comparator of FIG. 12 according to various example embodiments.

Referring to FIG. 16, the first comparison circuit 360 may include a plurality of comparators 361, 362, ..., 36s and a matching signal generator 360m.

Each of the plurality of comparators 361, 362, ..., 36s may generate respective one of a plurality of comparison signals CS21, CS22, ..., CS2s by comparing the first bits BA, CS and CID of the host physical address HPA with respective one the plurality of hash tags HTG1, HTG2, ..., HTGs.

The matching signal generator 360m may generate the first sub matching signal SMTS21 indicating hash tags that match the first bits of the host physical address HPA by comparing the first bits BA, CS and CID of the host physical address HPA from among the plurality of hash tags HTG1, HTG2, ..., HTGs based on the plurality of comparison signals CS21, CS22, ..., CS2s.

Figure 17:
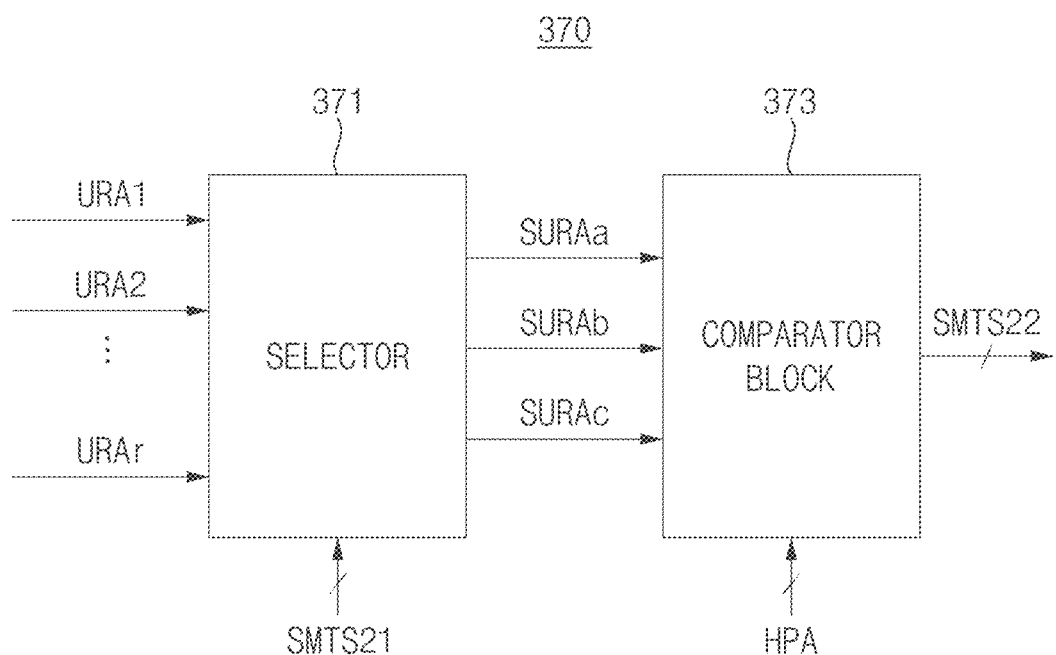
FIG. 17 is a block diagram illustrating an example of the second comparison circuit in the address comparator of FIG. 12 according to various example embodiments.

FIG. 17 is a block diagram illustrating an example of the second comparison circuit in the address comparator of FIG. 12 according to various example embodiments.

Referring to FIG. 17, the second comparison circuit 370 may include a selector 371 and a comparator block 373.

The selector 371 may select candidate unrepairable addresses which have hash tags matching the first bits of the host physical address HPA from among the plurality of hash tags HTG1, HTG2, ..., HTGs based on the first sub matching signal SMTS21, and may provide the comparator block 373 with second bits SURAa, SURAb and SURAc of the candidate unrepairable addresses.

The comparator block 373 may include a plurality of comparators and the plurality of comparators may generate the second sub matching signal SMTS22 indicating an unrepairable address having the second bits matching the second bits of the host physical address HPA by comparing the second bits of the host physical address HPA with respective second bits SURAa, SURAb and SURAc of the candidate unrepairable addresses.

Figure 18A:
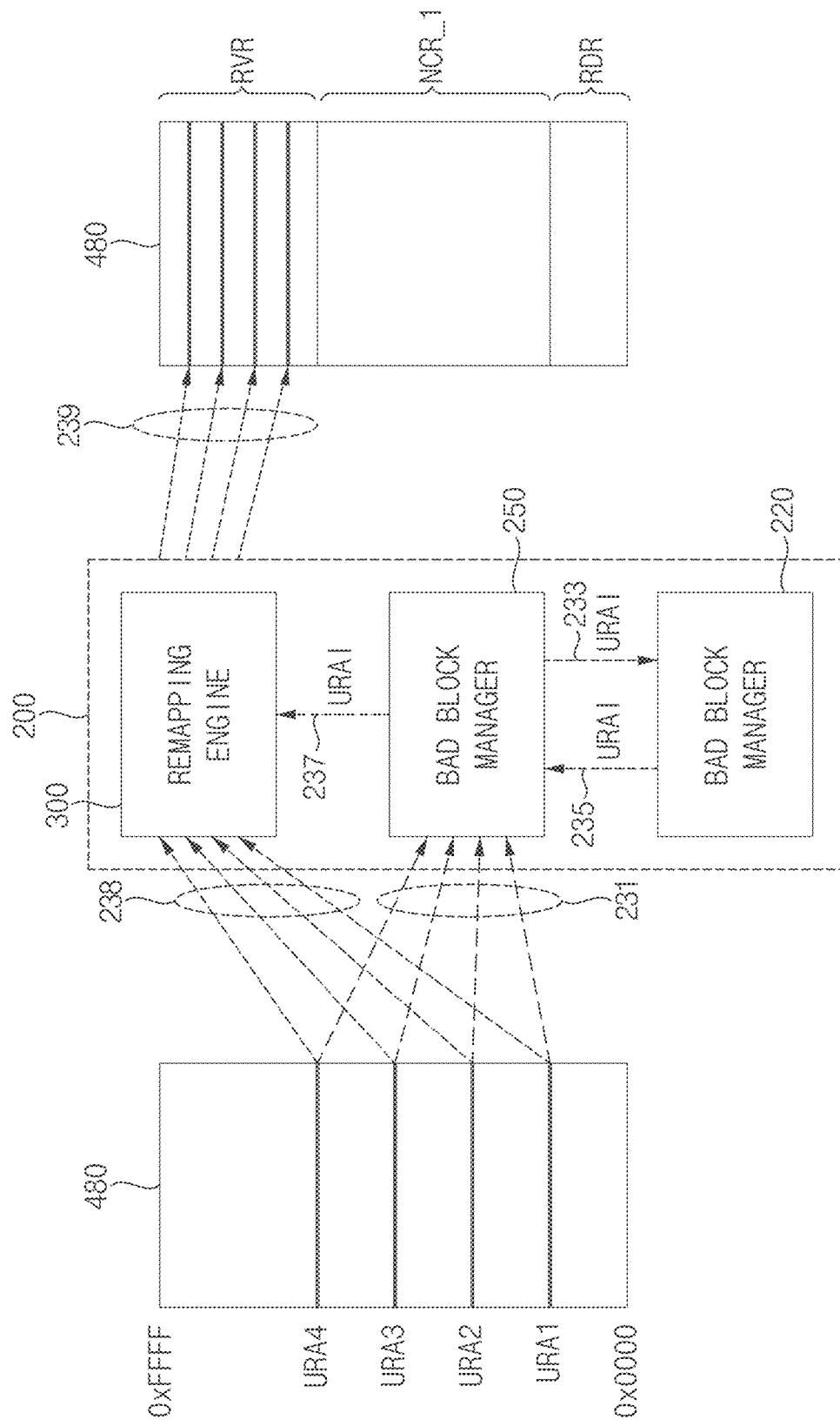
FIG. 18A illustrates an example operation of the memory system in FIG. 1 according to various example embodiments.

FIG. 18A illustrates an example operation of the memory system in FIG. 1 according to various example embodiments.

Referring to FIGS. 1 and 5 through 18A, the memory cell array 480 of the semiconductor memory device 401 may have consecutive physical addresses ranging from '0x0000' to '0xFFFF'. The BIST circuit 520 performs a test on a plurality of memory cells in the memory cell array 480 during a test mode and the BIRA circuit 525 determines a portion of defective memory cell rows have unrepairable addresses URA11, URA12, URA13 and URA14. The bad block manager 250 may receive the unrepairable addresses URA11, URA12, URA13 and URA14 from the BIRA circuit 525 in the test mode as indicated by a reference numeral 231 and may store the unrepairable addresses URA11, URA12, URA13 and URA14 in the nonvolatile storage 220 as the unrepairable address information URAI as indicated by a reference numeral 233 indicates.

The bad block manager 250 may allocate a portion of the normal cell region of the semiconductor memory device 401a as a reserved region RVR based on the unrepairable address information URAI. After the allocation, the memory cell array 480 may include a normal cell region NCR_1, the redundancy region RDR and the reserved region RVR. When the memory system 200 is booted, the bad block manager 250 may read the unrepairable address information URAI from the nonvolatile storage 220 as indicated by a reference numeral 235, and may provide the unrepairable address information URAI to the remapping engine 300 as indicated by a reference numeral 237.

The bad block manager 250 may in the normal operation, bypass accesses on the defective memory cell rows designated by the unrepairable addresses URA11, URA12, URA13 and URA14 to memory cell rows designated by physical addresses of the reserved region RVR of the memory cell array 480 by remapping the unrepairable addresses URA11, URA12, URA13 and URA14 to consecutive physical addresses of the reserved region RVR as indicated by a reference numeral 239 when the host physical address HPA for accessing the memory cell array 480, from at least one of the plurality of hosts 100a, 100b, . . . , 100k, matching one of the plurality of unrepairable addresses URA11, URA12, URA13 and URA14 included in the unrepairable address information URAI as indicated by a reference numeral 238.

Figure 18B:
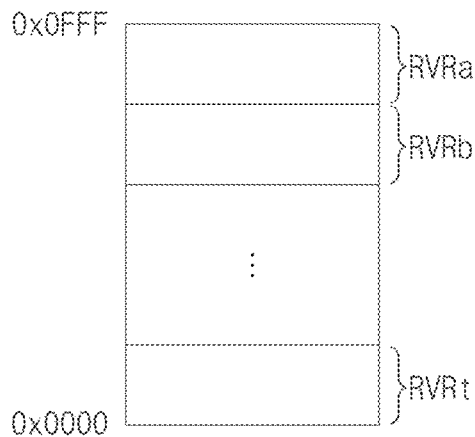
FIG. 18B illustrates an example of the reserved region according to various example embodiments.

FIG. 18B illustrates an example of the reserved region according to various example embodiments.

Referring to FIG. 18B, a reserved region RVR_t of the memory module 400 may include reserved regions RVRa, RVRb, . . . , RVRt of the plurality of semiconductor memory devices 401a, 402a, . . . , 40ta and 401b, 402b, . . . , 40tb in FIG. 1.

In some example embodiment, the reserved regions RVRa, RVRb, . . . , RVRt may provide the plurality of hosts 100a, 100b, . . . , 100k with consecutive physical addresses ranging from '0x0000' to '0xFFFF'.

Because the reserved region RVR_t needs or expects or uses consecutiveness, from the most significant bit MSB of an address of the reserved region RVR_t, addresses that replace unrepairable addresses may be allocated. From an address '0xFFFF' of the reserved region RVR_t, addresses that replace unrepairable addresses may be sequentially allocated. A granularity of the allocation may be designated as 128 MB or 256 MB such that the reserved region RVR_t is compatible with PCIe devices that follow the PCIe protocol based on the DVSEC. For example, the bad block manager 250 may divide, or partition, the reserved region RVR_t into a plurality of sub regions and each of the plurality of sub regions has a predetermined size based on the DVSEC.

Therefore, in some example embodiments the remapping engine 300 may remap a first unrepairable address of a first semiconductor memory device from among the plurality of semiconductor memory devices 401a, 402a, . . . , 40ta and 401b, 402b, . . . , 40tb to a reserved region of the first semiconductor memory device, and may remap a second unrepairable address of the first semiconductor memory device to a reserved region of a second semiconductor memory device from among the plurality of semiconductor memory devices 401a, 402a, . . . , 40ta and 401b, 402b, . . . , 40tb.

In some example embodiments, the remapping engine 300 may remap a first unrepairable address of a first semiconductor memory device from among the plurality of semiconductor memory devices 401a, 402a, . . . , 40ta and 401b, 402b, . . . , 40tb to a reserved region of the first semiconductor memory device, and may remap a second unrepairable address of a second semiconductor memory device from among the plurality of semiconductor memory devices 401a, 402a, . . . , 40ta and 401b, 402b, . . . , 40tb to the reserved region of the first semiconductor memory device.

Figure 19:
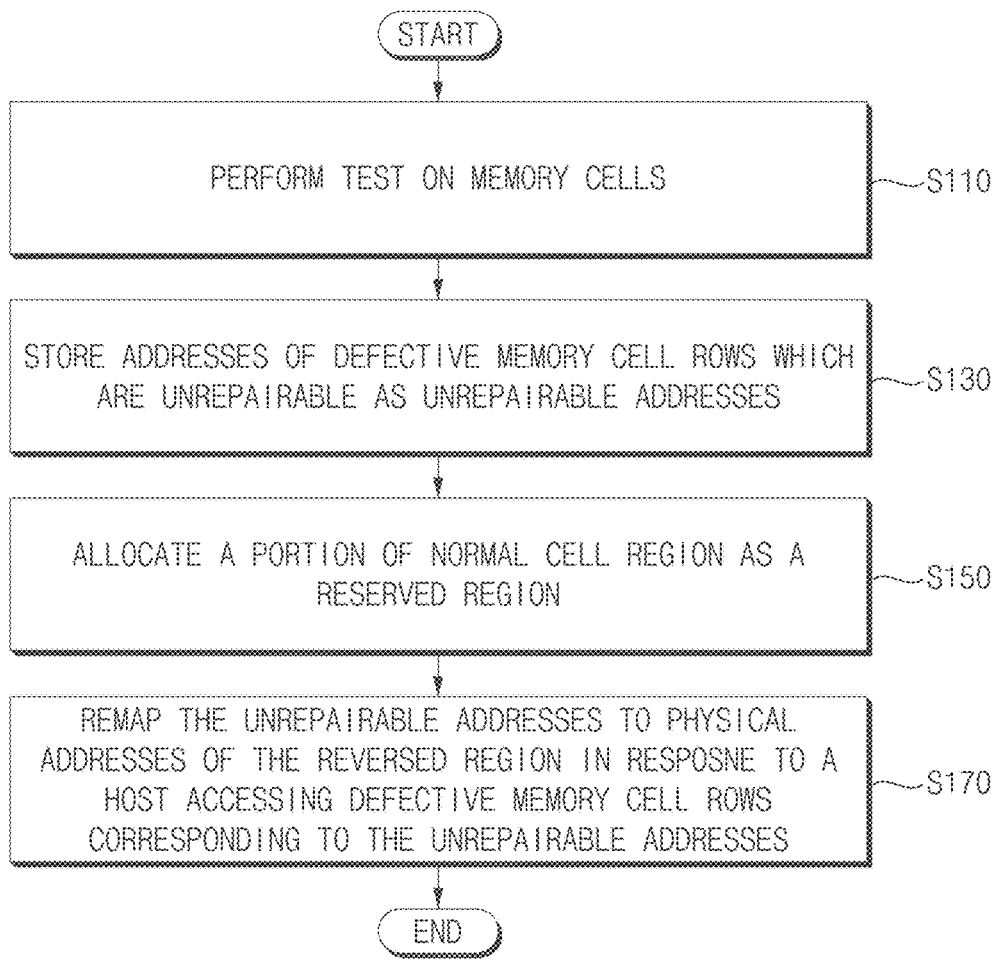
FIG. 19 is a flow chart illustrating a method of operating a memory system according to various example embodiments.

FIG. 19 is a flow chart illustrating a method of operating a memory system according to various example embodiments.

Referring to FIGS. 1 and 5 through 19, there is provided a method of operating a memory system 200 which includes a memory module 400 including a plurality of semiconductor memory devices 401a, 402a, . . . , 40ta and 401b, 402b, . . . , 40tb and a memory controller 210 connected to at least one host through a serial interface, and controls the plurality of semiconductor memory devices 401a, 402a, . . . , 40ta and 401b, 402b, . . . , 40tb. Each of the plurality of semiconductor memory devices 401a, 402a, . . . , 40ta and 401b, 402b, . . . , 40tb includes a memory cell array including a normal cell region and a redundancy cell region.

According to the method and to various example embodiments, a test on a plurality of memory cells in the memory cell array is performed in each of the plurality of semiconductor memory devices 401a, 402a, . . . , 40ta and 401b, 402b, . . . , 40tb in a test mode (operation S110).

A bad block manger 250 in the memory controller 210 stores addresses of defective memory ell rows that are unrepairable with a redundancy resource of the redundancy region as unrepairable addresses in a nonvolatile storage 220 in the memory controller 210, based on a result of the test (operation S130).

The memory controller 210 allocates a portion of the normal cell regions of at least one of the plurality of semiconductor memory devices 401a, 402a, . . . , 40ta and 401b, 402b, . . . , 40tb as a reserved region based on the unrepairable addresses (operation S150).

A remapping engine 300 in the memory controller 210 remaps the unrepairable addresses to consecutive physical addresses of the reserved region, in response to the at least one host accessing defective memory cell rows corresponding to the unrepairable addresses (operation S170). The physical addresses of the reserved region need consecutiveness, from the most significant bit MSB of an address of the reserved region, addresses that replace unrepairable addresses may be allocated. A granularity of the allocation may be designated as 128 MB or 256 MB such that the reserved region is compatible with PCIe devices that follow the PCIe protocol.

Therefore, a memory system and a method of operating a memory system according to various example embodiments, may increase usability of the memory module by allocating a portion of the normal cell region as a reserved region and by remapping at least one unrepairable address, which exceeds the available redundancy resources of the redundancy region of each of the plurality of semiconductor memory devices, to consecutive physical addresses of the reserved region.

Figure 20:
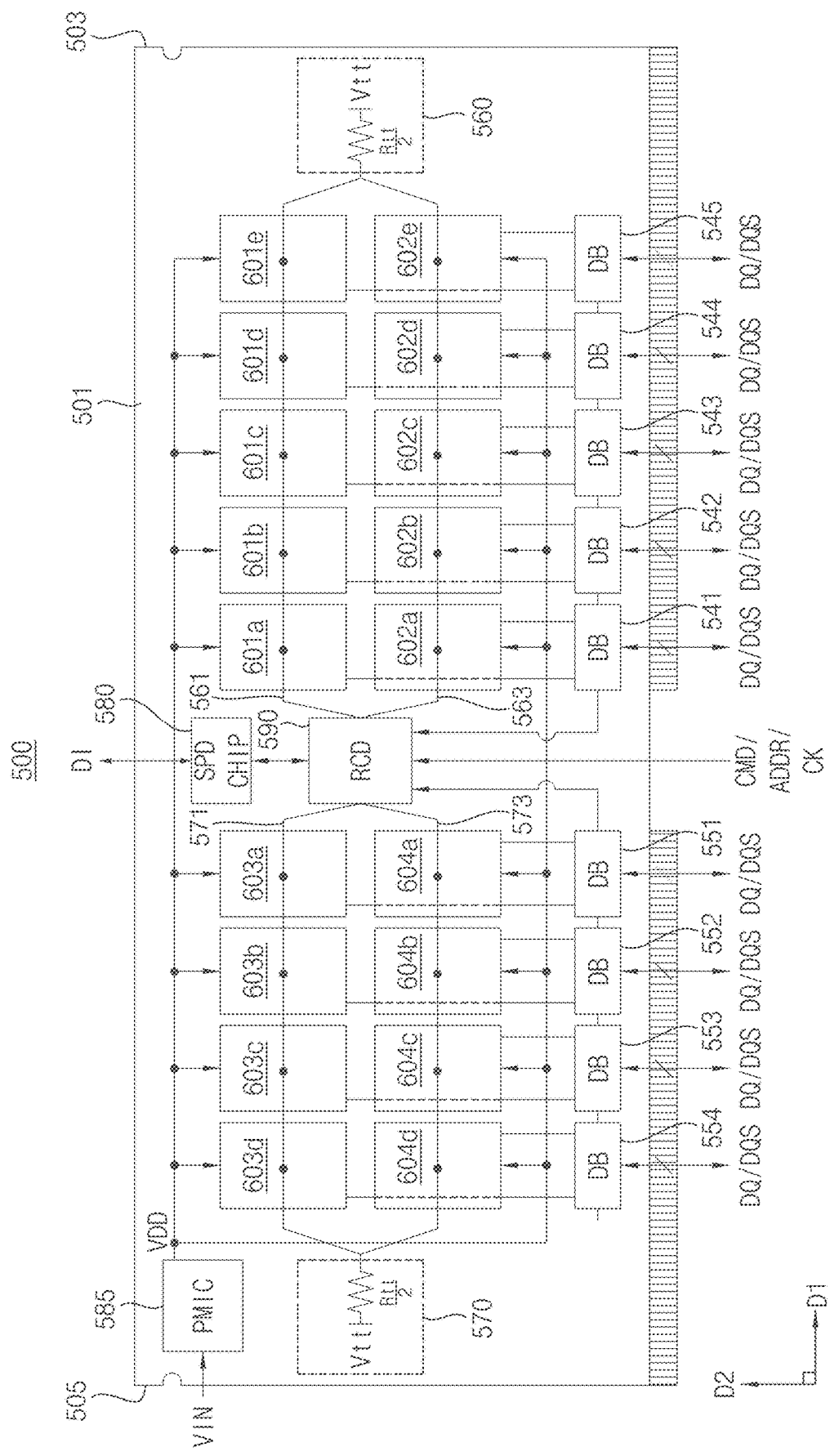
FIG. 20 is a block diagram illustrating a memory module that may be employed by the memory system according to various example embodiments.

FIG. 20 is a block diagram illustrating a memory module that may be employed by the memory system according to various example embodiments.

Referring to FIG. 20, a memory module 500 may include a registered clock driver (RCD) 290 disposed in or mounted on a circuit board 501, a plurality of semiconductor memory devices 601a~601e, 602a~602e, 603a~603d, and 604a~604d, a plurality of data buffers 541~545 and 551~555, module resistance units 560 and 570, the serial present detect (SPD) chip 580, and a power management integrated circuit (PMIC) 585.

The RCD 590 may control the semiconductor memory devices 601a~601e, 602a~602e, 603a~603d, and 604a~604d and the PMIC 585 under control of the memory controller 100. For example, the RCD 590 may receive an address ADDR, a command CMD, and a clock signal CK from the memory controller 210.

The SPD chip 580 may be, include, or be included in a programmable read only memory (e.g., EEPROM). The SPD chip 580 may include initial information or device information DI of the memory module 500. In example embodiments, the SPD chip 580 may include the initial information or the device information DI such as a module form, a module configuration, a storage capacity, a module type, an execution environment, or the like of the memory module 500.

When a memory system including the memory module 500 is booted up or started, the memory controller 210 may read the device information DI from the SPD chip 580 and may recognize the memory module 500 based on the device information DI. The memory controller 210 may control the memory module 500 based on the device information DI from the SPD chip 580. For example, the memory controller 210 may recognize a type of the semiconductor memory devices included in the memory module 500 based on the device information DI from the SPD chip 580.

Here, the circuit board 501 which is a printed circuit board may extend in a first direction D1, perpendicular to a second direction D2, between a first edge portion 503 and a second edge portion 505. The first edge portion 503 and the second edge portion 105 may extend in the second direction D2.

The RCD 590 may be disposed on a center of the circuit board 501. The plurality of semiconductor memory devices 601a~601e, 602a~602e, 603a~603d, and 604a~604d may be arranged in a plurality of rows between the RCD 590 and the first edge portion 503 and between the control device 590 and the second edge portion 505.

In this case, the semiconductor memory devices 601a~601e and 602a~602e may be arranged along a plurality of rows between the RCD 590 and the first edge portion 503. The semiconductor memory devices 603a~603d, and 604a~604d may be arranged along a plurality of rows between the RCD 590 and the second edge portion 505. The semiconductor memory devices 601a~601d, 602a~602d, 603a~603d, and 604a~604d may be referred to data chip and the semiconductor memory devices 601e and 602e may be referred to as first and second parity chips respectively.

Each of the plurality of semiconductor memory devices 601a~601e, 602a~602e, 603a~603d, and 604a~604d may be coupled to a corresponding one of the data buffers 541~545 and 551~554 through a data transmission line for receiving/transmitting data signal DQ and data strobe signal DQS.

The RCD 590 may provide a command/address signal (e.g., CA) to the semiconductor memory devices 601a~601e through a command/address transmission line 561 and may provide a command/address signal to the semiconductor memory devices 602a~602e through a command/address transmission line 563.

In addition, the RCD 590 may provide a command/address signal to the semiconductor memory devices 603a~603d through a command/address transmission line 571 and may provide a command/address signal to the semiconductor memory devices 604a~604d through a command/address transmission line 573.

The command/address transmission lines 561 and 563 may be connected in common to the module resistance unit 560 disposed to be adjacent to the first edge portion 503, and the command/address transmission lines 571 and 573 may be connected in common to the module resistance unit 570 disposed to be adjacent to the second edge portion 505.

Each of the module resistance units 560 and 570 may include a termination resistor Rtt/2 connected to a termination voltage Vtt. In this case, an arrangement of the module resistance units 560 and 570 may reduce the number of the module resistance units, thus reducing an area where termination resistors are disposed.

In addition, each of the plurality of semiconductor memory devices 601a~601e, 602a~602e, 603a~603d, and 604a~604d may be or may include a DRAM device.

The SPD chip 580 is disposed to be adjacent to the RCD 590 and the PMIC 585 may be disposed between the semiconductor memory device 603d and the second edge portion 505. The PMIC 585 may generate a power supply voltage VDD based on an input voltage VIN and may provide the power supply voltage VDD to the semiconductor memory devices 601a~601e, 602a~602e, 603a~603d, and 604a~604d.

Although it is illustrated as the PMIC 585 is disposed to be adjacent to the second edge portion 505 in FIG. 20, the PMIC 585 may be disposed in a central portion of the circuit board 501 to be adjacent to the RCD 590 in various example embodiments.

Figure 21:
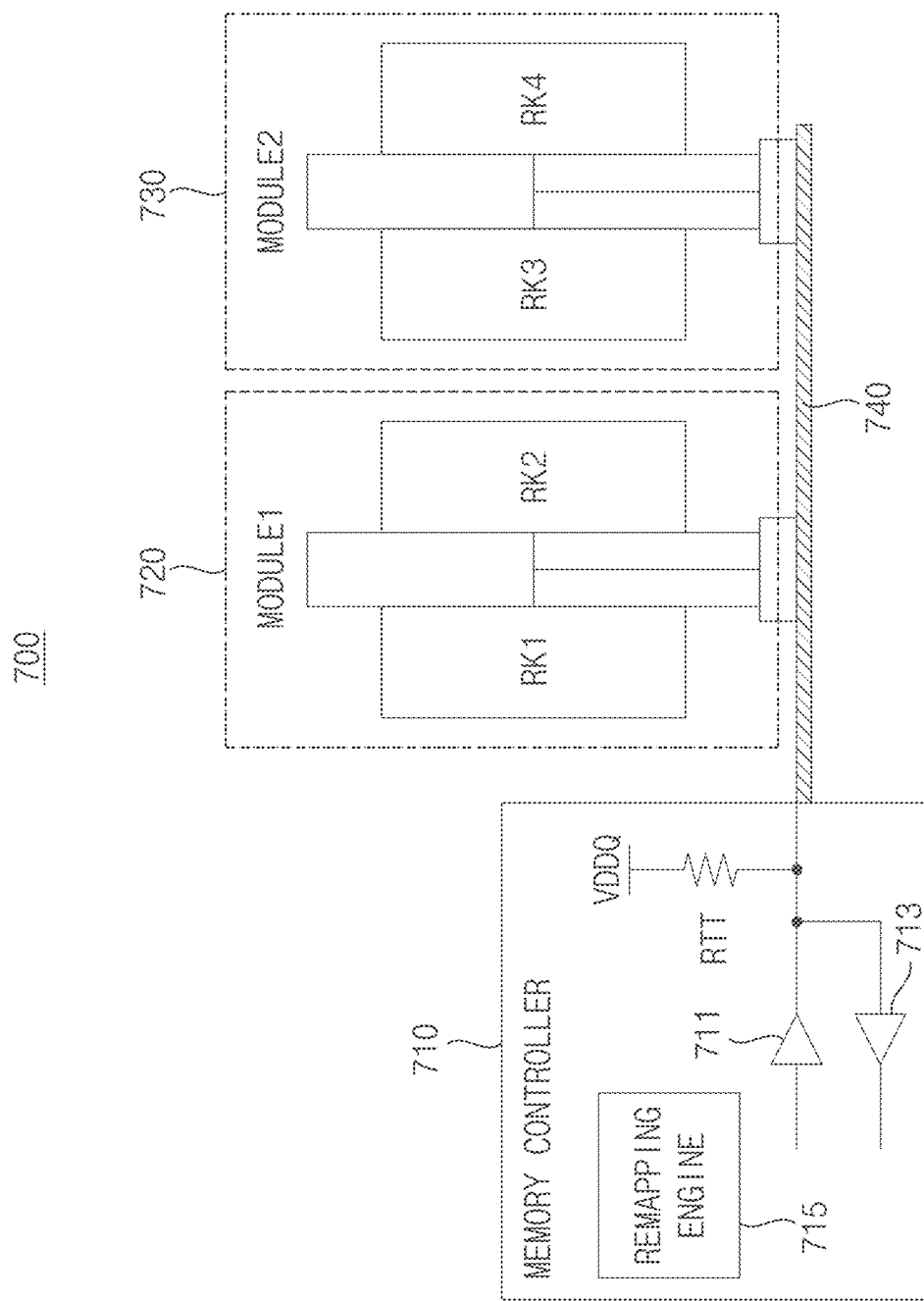
FIG. 21 is a block diagram illustrating a memory system having quad-rank memory modules according to various example embodiments.

FIG. 21 is a block diagram illustrating a memory system having quad-rank memory modules according to various example embodiments.

Referring to FIG. 21, a memory system 700 may include a memory controller 710 and at least one or more memory modules 720 and 730.

The memory controller 710 may control a memory module 720 and/or 730 so as to perform a command supplied from a processor or host. The memory controller 710 may be implemented in a processor or host, or may be implemented with an application processor or a system-on-a-chip (SoC). The memory controller 710 may include a transmitter 711 to transmit a signal to the at least one or more memory modules 720 and 730, and a receiver 713 to receive a signal from the at least one or more memory modules 720 and 730. For signal integrity, a source termination may be implemented with a resistor RTT on a bus 740 of the memory controller 710. The resistor RTT may be coupled to a power supply voltage VDDQ. The memory controller 710 may include a remapping engine 715 and the remapping engine 715 may employ the remapping engine 300 of FIG. 9.

Therefore, the remapping engine 715 may increase usability of the one or more memory modules 720 and 730 by remapping unrepairable addresses of each of a plurality of semiconductor memory devices in the one or more memory modules 720 and 730 to consecutive physical addresses of a reserved region of each of the plurality of semiconductor memory devices in the one or more memory modules 720 and 730.

The at least one or more memory modules 720 and 730 may be referred to as a first memory module 720 and a second memory module 730. The first memory module 720 and the second memory module 730 may be coupled to the memory controller 710 through the bus 740. The first memory module 720 may include at least one or more memory ranks RK1 and RK2, and the second memory module 730 may include one or more memory ranks RK3 and RK4.

Each of the first memory module 720 and the second memory module 730 may include a plurality of semiconductor memory devices.

Figure 22:
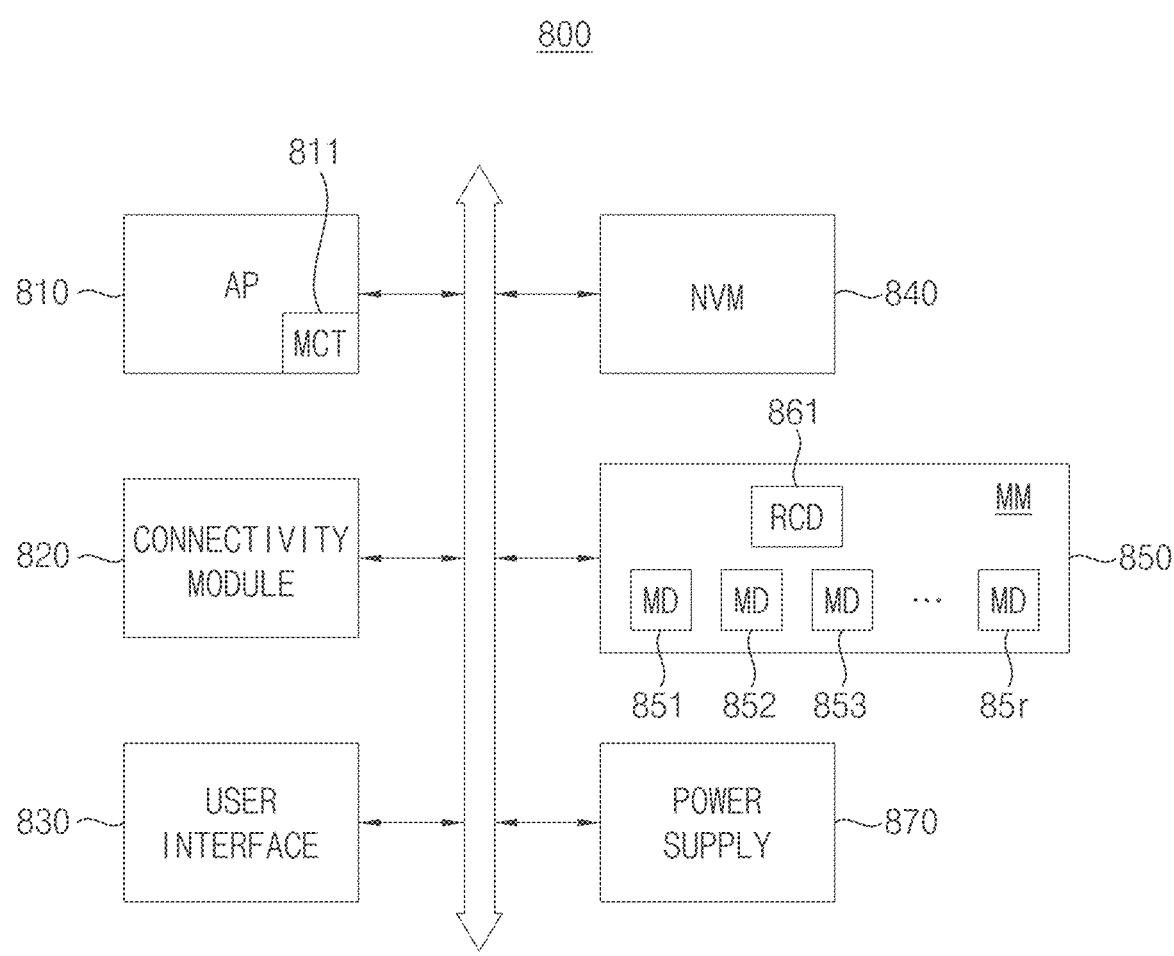
FIG. 22 is a block diagram illustrating a mobile system including a memory module according to various example embodiments.

FIG. 22 is a block diagram illustrating a mobile system including a memory module according to various example embodiments.

Referring to FIG. 22, a mobile system 800 may include an application processor 810, a connectivity module 820, a memory module MM 850, a nonvolatile memory device 840, a user interface 830, and a power supply 870. The application processor 810 may include a memory controller (MCT) 811. The memory controller 811 may include the remapping engine 300 of FIG. 9.

The application processor 810 may execute applications, such as a web browser, a game application, a video player, etc. The connectivity module 820 may perform wired or wireless communication with an external device.

The memory module 850 may store data processed by the application processor 810 or operate as a working memory. The memory module 850 may include a plurality of semiconductor memory devices MD 851, 852, 853, and 85$q$ (where 1 is a positive integer greater than three), and a RCD 861.

Therefore, the remapping engine in the memory controller 811 may increase usability of the memory module 850 by remapping unrepairable addresses of each of the plurality of semiconductor memory devices 851, 852, 853, and 85$q$ to consecutive physical addresses of a reserved region of each of the plurality of semiconductor memory devices 851, 852, 853, and 85$q$.

The nonvolatile memory device 840 may store a boot image for booting the mobile system 800. The user interface 830 may include at least one input device, such as a keypad, a touch screen, etc., and at least one output device, such as a speaker, a display device, etc. The power supply 870 may supply an operating voltage to the mobile system 800.

The mobile system 800 or components of the mobile system 800 may be mounted using various types of packages.

Figure 23:
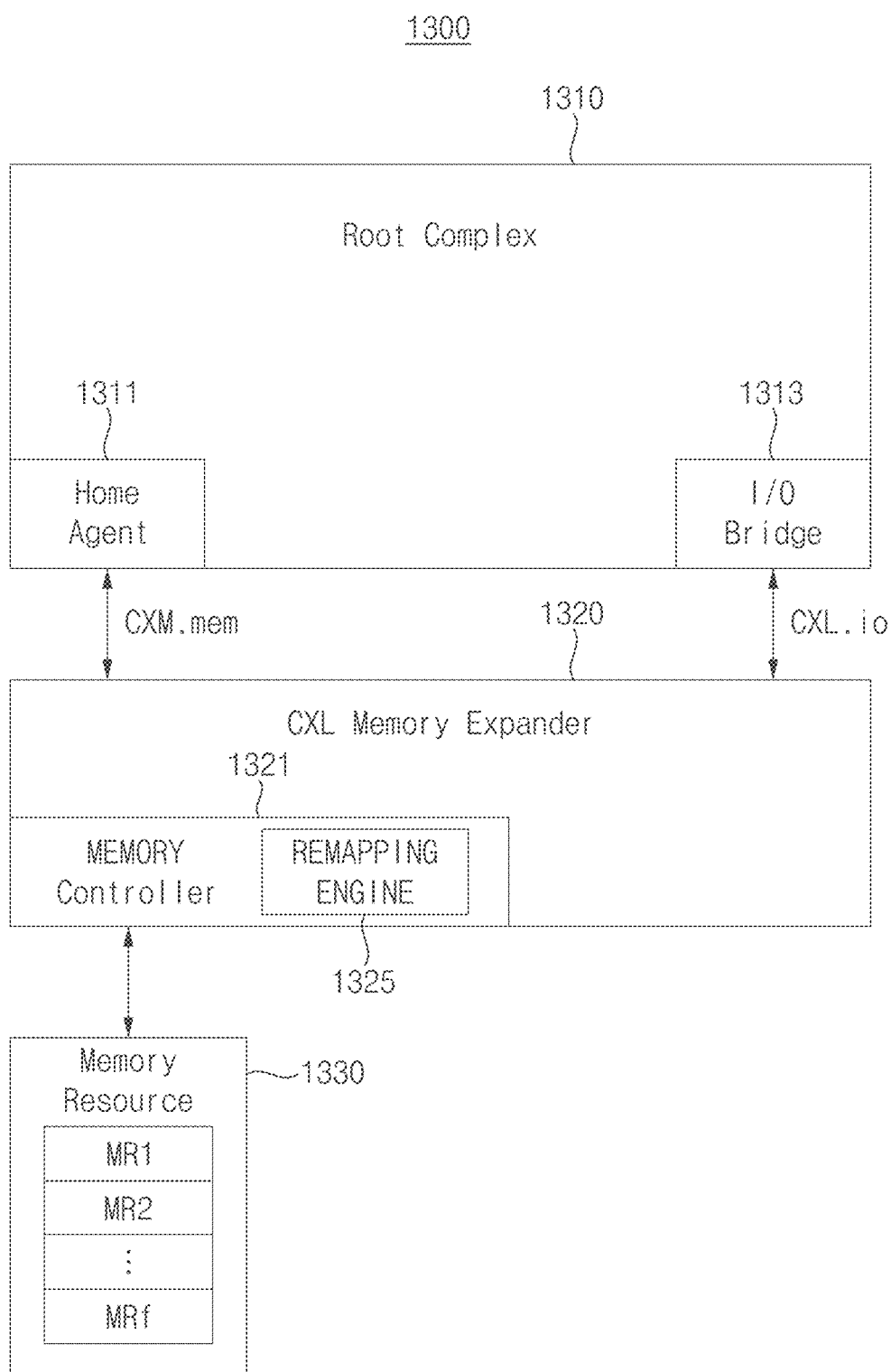
FIG. 23 is an example of a computing system when a memory system according to various example embodiments corresponds to a Type 3 memory system defined by a CXL protocol.

FIG. 23 is an example of a computing system when a memory system according to various example embodiments corresponds to a Type 3 memory system defined by a CXL protocol.

Referring to FIG. 23, a computing system 1300 may include a root complex 1310, a CXL memory expander 1320 connected to the root complex 1310 and a memory resource 1330. The memory resource 1330 may correspond to the memory module 400 in FIG. 1.

The root complex 1310 may include a home agent 1311 and an I/O bridge 1313, and the home agent 1310 may communicate with the CXL memory expander 1320 based on a coherent protocol CXL.mem the I/O bridge 1313 may communicate with the CXL memory expander 1320 based on a non-coherent protocol, e.g., an I/O protocol CXL.io. In a CXL protocol base, the home agent 1310 may correspond to an agent on a host side that is arranged to solve the entire consistency of the computing system 1300 for a given address.

The CXL memory expander 1320 may include a memory controller 1321 and the smart controller 1321 may employ the memory controller 210 in FIG. 1 and may include a remapping engine 1325.

In addition, the CXL memory expander 1320 may output data to the root complex 1310 via the I/O bridge 1313 based on the I/O protocol CXL.io or the PCIe.

The memory resource 1330 may include a plurality of memory regions MR1, MR2, . . . , MRf and each of the plurality of memory regions MR1, MR2, . . . , MRf may be implemented as a memory of a various units. Here, f may be a natural number greater than two.

Figure 24:
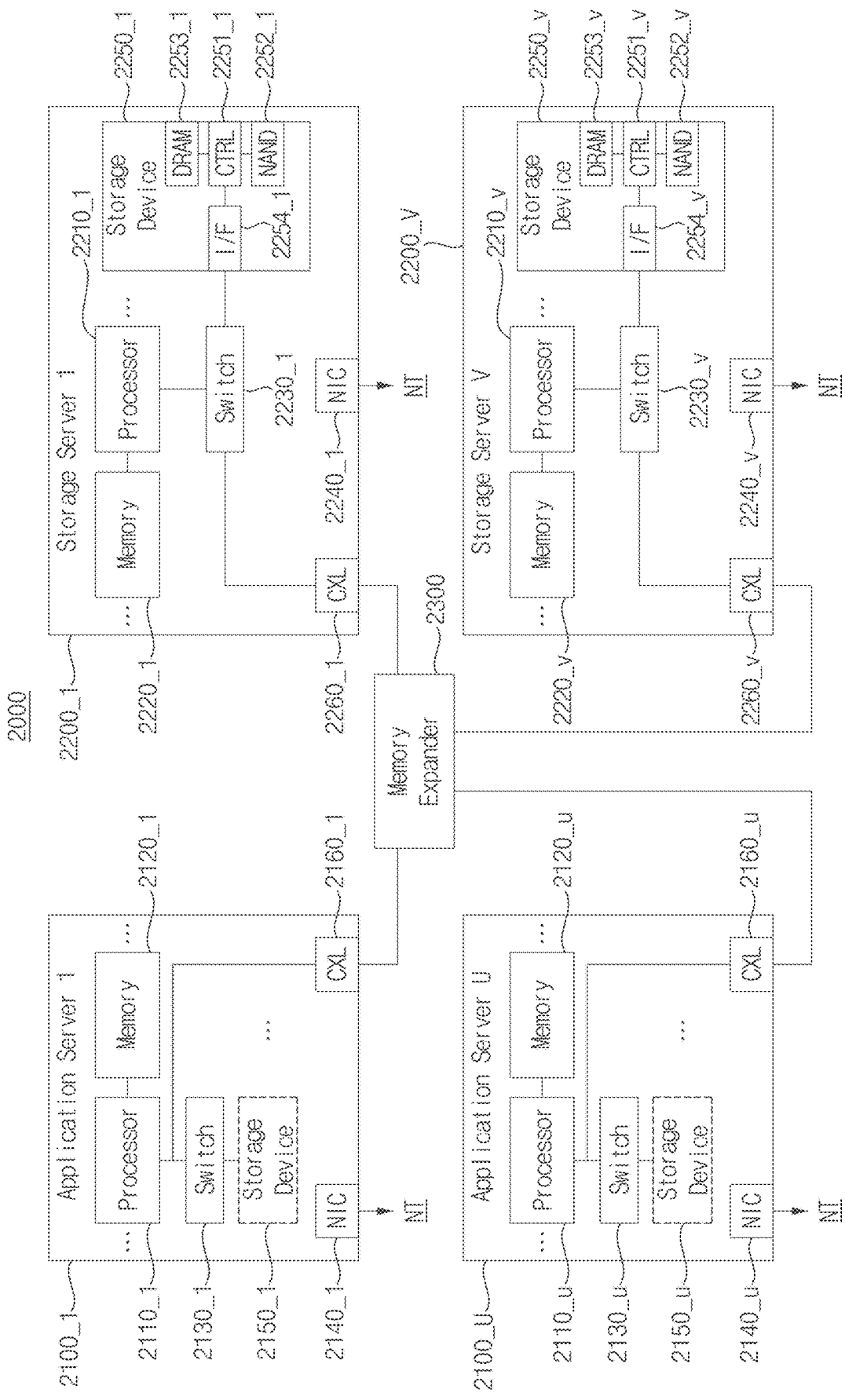
FIG. 24 is a block diagram illustrating a data center including a computing system according to various example embodiments.

FIG. 24 is a block diagram illustrating a data center including a computing system according to various example embodiments.

Referring to FIG. 24, a data center 2000 may be a facility that collects various types of data and provides various services, and may be referred to as a data storage center. The data center 2000 may be a system for operating search engines and databases, and may be a computing system used by companies such as banks or government agencies. The data center 2000 may include application servers 2100_1 to 2100_U and storage servers 2200_1 to 2200_V. The number of the application servers 2100_1 to 2100_U and the number of the storage servers 2200_1 to 2200_V may be variously selected according to various example embodiments, and the number of the application servers 2100_1 to 2100_U and the number of the storage servers 2200_1 to 2200_V m may be different from each other.

Below, for convenience of description, an example of the storage server 2200_1 will be described.

The storage server 2200_1 may include a processor 2210_1, a memory 2220_1, a switch 2230_1, a network interface controller (NIC) 2240_1, a storage device 2250_1 and CXL interface 2250_1. The storage server 2200_V may include a processor 2210_$v$, a memory 2220_$v$, a switch 2230_$v$, a NIC 2240_$v$, a storage device 2250_$v$ and CXL interface 2250_$v$.

The processor 2210_1 may control overall operation of the storage server 2200_1. The memory 2220_1 may store various instructions or data under control of the processor 2210_1. The processor 2210_1 may be configured to access the memory 2220_1 to execute various instructions or to process data. In an embodiment, the memory 2220_1 may include at least one of various kind of memory devices such as double data rate synchronous DRAM (DDR SDRAM), high bandwidth memory (HBM), hybrid memory cube (HMC), dual in-line memory module (DIMM), Optane DIMM or non-volatile DIMM.

In various example embodiments, the number of the processors 2210_1 included in the storage server 2200_1 and the number of the memories 2220_1 included in the storage server 2200_1 may be variously changed or modified. In various example embodiments, the processor 2210_1 and the memory 2220_1 included in the storage server 2200_1 may constitute a processor-memory pair and the number of processor-memory pairs included in the storage server 2200_1 may be variously changed or modified. In some example embodiments, the number of the processors 2210_1 included in the storage server 2200_1 and the number of the memories 2220_1 included in the storage server 2200_1 may be different. The processor 2210_1 may include a single core processor and a multi-core processor.

Under control of the processor 2210_1, the switch 2230_1 may selectively connect the processor 2210_1 and the storage device 2250_1 or may selectively connect the NIC 2240-1, the storage device 2250_1 and the CXL 2240_1.

The NIC 2240_1 may connect the storage server 2220_1 with a network NT. The NIC 2240_1 may include a network interface card, a network adapter, and the like. The NIC 2240_1 may be connected to the network NT through a wired interface, a wireless interface, a Bluetooth interface, or an optical interface. The NIC 2240_1 may include an internal memory, a digital signal processor (DSP), a host bus interface, and the like and may be connected with the processor 2210_1 or the switch 2230_1 through the host bus interface. The host bus interface may include at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, a compute express link (CXL), an IEEE 1394, a universal serial bus (USB), a secure digital (SD) card interface, a multimedia card (MMC) interface, an embedded MMC (eMMC) interface, a universal flash storage (UFS) interface, an embedded UFS (eUFS) interface, a compact flash (CF) card interface, etc. In various example embodiments, the NIC 2240_1 may be integrated with at least one of the processor 2210_1, the switch 2230_1 and the storage device 2250_1.

Under control of the processor 2210_1, the storage device 2250_1 may store data or may output the stored data. The storage device 2250_1 may include a controller CTRL 2251_1, a nonvolatile memory NAND 2252_1, a DRAM 2253_1 and an interface I/F 2254_1. In various example embodiments, the storage device 2250_1 may further include a secure element SE for security or privacy. The storage device 2250_v may include a controller CTRL 2251_v, a nonvolatile memory NAND 2252_v, a DRAM 2253_v and an interface I/F 2254_v. In various example embodiments, the storage device 2250_v may further include a secure element SE for security or privacy.

The controller 2251_1 may control overall operation of the storage device 2250_1. The controller 2251_1 may include an SRAM. In response to signals received through the interface 2254_1, the controller 2251_1 may store data in the nonvolatile memory 2252_1 or may output data stored in the nonvolatile memory 2252_1. The controller 2251_1 may be configured to control the nonvolatile memory 2252_1 based on a toggle interface or an ONFI.

The DRAM 2253_1 may be configured to temporarily store data to be stored in the nonvolatile memory 2252_1 or data read from the nonvolatile memory 2252_1. The DRAM 2253_1 may be configured to store various data (e.g., metadata and mapping data) necessary of the controller 2251_1 to operate. The interface 2254_1 may provide a physical connection between the controller 2251_1 and the processor 2210_1, the switch 2230_1 or the NIC 2240_1. The interface 2254_1 may be implemented to support direct-attached storage (DAS) manner that allows the direct connection of the storage device 2250_1 through a dedicated cable. The interface 2254_1 may be implemented based on at least one of various above-described interfaces through a host interface bus.

The above components of the storage server 2200_1 are provided as an example, and example embodiments are not limited thereto. The above components of the storage server 2200_1 may be applied to each of the other storage servers or each of the application servers 2100_1 to 2100_U. In each of the application servers 2100_1 to 2100_U, a storage device 2150_1 may be selectively omitted.

The application server 2100_1 may include a processor 2110_1, a memory 2120_1, a switch 2130_1, a NIC 2140_1, and CXL interface 2160_1. The application server 2100_U may include a processor 2110_u, a memory 2120_u, a switch 2130_u, a NIC 2140_u, and CXL interface 2160_u.

The application servers 2100_1 to 2100_U and the storage servers 2200_1 to 2200_V may communicate with each other through the network NT. The network NT may be implemented using a fiber channel (FC) and/or an Ethernet. The FC may be a medium used for a relatively high speed data transmission, and an optical switch that provides high performance and/or high availability may be used. The storage servers 2200_1 to 2200_V may be provided as file storages, block storages or object storages according to an access scheme of the network 3300.

In some example embodiments, the network NT may be a storage-only network or a network dedicated to a storage such as a storage area network (SAN). For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In some example embodiments, the network NT may be a general network such as the TCP/IP network. For example, the network NT may be implemented according to at least one of protocols such as an FC over Ethernet (FCoE), a network attached storage (NAS), a nonvolatile memory express (NVMe) over Fabrics (NVMe-oF), etc.

In some example embodiments, at least one of the plurality of application servers 2100_1 to 2100_U may be configured to access at least one of the remaining application servers or at least one of the storage servers 2200_1 to 2200_V over the network NT.

For example, the application server 2100_1 may store data requested by s user or a client in at least one of the storage servers 2200_1 to 2200_V over the network NT. Alternatively, the application server 2100_1 may obtain data requested by s user or a client in at least one of the storage servers 2200_1 to 2200_V over the network NT. In this case, the application server 2100_1 may be implemented with a web server, a database management system (DBMS), or the like.

The application server 2100_1 may access a memory 2120_1 or a storage device 2105_1 of the application server 2100_1 or the storage device 2250_1 of the storage server 2000_1 over the network NT. As such, the application server 2100_1 may perform various operations on data stored in the application servers 2100_1 to 2100_U and/or the storage servers 2200_1 to 2200_V. For example, the application server 2100_1 may execute a command for moving or copying data between the application servers 2100_1 to 2100_U and/or the storage servers 2200_1 to 2200_V. The data may be transferred from the storage devices 2250_1 to 2250_v of the storage servers 2200_1 to 2200_V to the memories 2120_1 to 2120_u of the application servers 2100_1 to 2100_U directly or through the memories 2220_1 to 2220_v of the storage servers 2200_1 to 2200_V. For example, the data transferred through the network NT may be encrypted data for security or privacy.

The storage servers 2200_1 to 2200_V and the application servers 2100_1 to 2100_U may be connected with a memory expander 2300 through the CXL interfaces 2260_1 to 2260_v and 2160_1 to 2160_u. The memory expander 2300 may be used as expanded memory of each of the storage servers 2200_1 to 2200_V and the application servers 2100_1 to 2100_U or virtualized component included therein may communicate with each other through the CXL interfaces 2260_1 to 2260_v and 2160_1 to 2160_u and the memory expander 2300.

Some example embodiments may be applied to various electronic devices and systems that include high storage capacity memory devices. For example, some examples may be applied to systems such as one or more of a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

[0002] Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Any or all of the elements described with reference to the figures may communicate with any or all other elements described with reference to the respective figures. For example, any element may engage in one-way and/or two-way and/or broadcast communication with any or all other elements in the respective figures, to transfer and/or exchange and/or receive information such as but not limited to data and/or commands, in a manner such as in a serial and/or parallel manner, via a bus such as a wireless and/or a wired bus (not illustrated). The information may be in encoded various formats, such as in an analog format and/or in a digital format.

The foregoing is illustrative of various example embodiments and is not to be construed as limiting thereof. Although a few example embodiments have been described, those of ordinary skill in the art will readily appreciate that many modifications are possible in the example embodiments without materially departing from the novel teachings and advantages of the present disclosure. Accordingly, all such modifications are intended to be included within the scope as defined in the claims. Furthermore example embodiments are not necessarily mutually exclusive with one another. For example, some example embodiments may include one or more features described with reference to one or more figures, and may also include one or more features described with reference to one or more other figures.

What is claimed is:

1. A memory system comprising:
a memory module including a plurality of semiconductor memory devices; and
a memory controller connected to at least one host through a serial interface, the memory controller configured to control the plurality of semiconductor memory devices, wherein
each of the plurality of semiconductor memory devices includes a memory cell array that includes a normal cell region and a redundancy region, and
each of the plurality of semiconductor memory devices is configured to provide the memory controller with an address of at least a first defective memory cell row from among defective memory cell rows in the normal cell region as an unrepairable address information, the at least first defective memory cell row being unrepairable with a redundancy resource of the redundancy region,
wherein the memory controller is configured to:
allocate a portion of the normal cell regions of at least one of the plurality of semiconductor memory devices as a reserved region;
remap a first unrepairable address to a first physical address of the reserved region in response to a first host physical address from the at least one host matching the first unrepairable address in the unrepairable address information; and
remap a second unrepairable address to a second physical address of the reserved region in response to a second host physical address from the at least one host matching the second unrepairable address in the unrepairable address information, and
wherein the first physical address and the second physical address are consecutive.

2. The memory system of claim 1, wherein the serial interface corresponds to a compute express link (CXL) interface.

3. The memory system of claim 1, wherein the memory controller is configured to allocate the portion of the normal cell regions of the at least one of the plurality of semiconductor memory devices as the reserved region based on a designated vendor specific extended capability (DVESC).

4. The memory system of claim 3, wherein the memory controller is configured to divide the normal cell region into a plurality of sub regions, each of the plurality of sub regions having a first size, and allocate at least one of the plurality of sub regions as the reserved region, based on the DVESC.

5. The memory system of claim 1, wherein the memory controller comprises:
a nonvolatile storage;
a bad block manager configured to receive the unrepairable address information from the plurality of semiconductor memory devices in a test mode, and to store the unrepairable address information in the nonvolatile storage; and
a remapping engine configured to receive the nonvolatile storage and selectively remap a host physical address from the at least one host in a physical address of the reserved region by comparing the host physical address with the unrepairable address information.

6. The memory system of claim 5, wherein the remapping engine comprises:
a register configured to store the unrepairable address information;
an address comparator configured to generate a selection signal and a matching information signal by comparing the host physical address with each of a plurality of unrepairable addresses included in the unrepairable address information, the selection signal indicating whether the host physical address matches one of the plurality of unrepairable addresses, the matching information signal designating a target unrepairable address that matches the host physical address, the target unrepairable address from among the plurality of unrepairable addresses;
a remapping table configured to output a target physical address mapped to the target unrepairable address based on the matching information signal; and
a multiplexer configured to output one of the host physical address and the target physical address as a device physical address based on the selection signal.

7. The memory system of claim 6, wherein the multiplexer is configured to output the target physical address as the device physical address in response to the selection signal indicating that the host physical address matches one of the plurality of unrepairable addresses.

8. The memory system of claim 6, wherein the multiplexer is configured to output the host physical address as the device physical address in response to the selection signal indicating that the host physical address does not match respective one of the plurality of unrepairable addresses.

9. The memory system of claim 6, wherein
the remapping table is configured to store mapping relationship between the plurality of unrepairable addresses and physical addresses of the reserved region, and
wherein the physical addresses are consecutive.

10. The memory system of claim 6, wherein the address comparator comprises:
a plurality of comparators, each of the plurality of comparators configured to generate a respective one of a plurality of comparison signals by comparing the host physical address with respective one of the plurality of unrepairable addresses; and
a signal generator configured to generate the selection signal and the matching information signal based on the plurality of comparison signals.

11. The memory system of claim 6, wherein the address comparator comprises:
a hashing logic configured to generate a plurality of hash tags by hashing first bits of each of the plurality of unrepairable addresses;
a first comparison circuit configured to generate a first sub matching signal by comparing first bits of the host physical address and the plurality of hash tags;
a second comparison circuit configured to generate a second sub matching signal by comparing second bits of the host physical address and second bits of candidate unrepairable addresses which have hash tags matching the first bits of the host physical address, the candidate unrepairable addresses being from among the plurality of unrepairable addresses; and
a signal generator configured to generate the selection signal and the matching information signal based on the first sub matching signal and the second sub matching signal.

12. The memory system of claim 11, wherein the signal generator is configured to generate the selection signal indicating that the host physical address does not match respective one of the plurality of unrepairable addresses, when the first sub matching signal indicates that the first bits of the host physical address do not match respective one of the plurality of hash tags.

13. The memory system of claim 5, wherein the bad block manager is configured to read the unrepairable address information from the nonvolatile storage and to provide the unrepairable address information to the remapping engine whenever the memory system is booted.

14. The memory system of claim 1, wherein each of the plurality of semiconductor memory devices comprises:
the memory cell array including a plurality of memory cell rows, each of the plurality of memory cell rows connected to a plurality of memory cells;
a built-in self-test (BIST) circuit configured to determine the defective memory cell rows from among the plurality of memory cell rows by performing a test on the plurality of memory cells in a test mode; and
a built-in redundancy analysis (BIRA) circuit configured to repair second defective memory cell rows from among the defective memory cell rows with redundancy resources and to provide the memory controller with an address of the at least first defective memory cell row.

15. The memory system of claim 14, wherein the BIRA circuit is configured to determine at least one memory cell row exceeding a repair capability of the redundancy resource as the at least first defective memory cell row.

16. The memory system of claim 14, wherein the BIST circuit, in the test mode, is configured to:
write a test pattern data in each of the plurality of memory cells;
read a test result data responding to the test pattern data from each of the plurality of memory cells; and
determine the defective memory cell rows based on comparison of the test pattern data and the test result data.

17. The memory system of claim 16, wherein the BIST circuit is configured to determine memory cell rows including defective memory cells equal to or greater than a reference value as the defective memory cell rows, the test result data read from each of the defective memory cells not matching the test pattern data.

18. A method of operating a memory system, wherein the memory system includes a memory module including a plurality of semiconductor memory devices and a memory controller connected to at least one host through a serial interface, and is configured to control the plurality of semiconductor memory devices, and wherein each of the plurality of semiconductor memory devices includes a memory cell array including a normal cell region and a redundancy region, the method comprising:
performing, in each of the plurality of semiconductor memory devices, a test on a plurality of memory cells in the memory cell array, in a test mode;
storing addresses of defective memory ell cell rows that are unrepairable with a redundancy resource of the redundancy region as unrepairable addresses in a nonvolatile storage in the memory controller, based on a result of the test;
allocating, by the memory controller, a portion of the normal cell regions of at least one of the plurality of semiconductor memory devices as a reserved region based on the unrepairable addresses; and
remapping, by the memory controller, the unrepairable addresses to consecutive physical addresses of the reserved region, in response to the at least one host accessing defective memory cell rows corresponding to the unrepairable addresses.

19. The method of claim 18, wherein the memory controller is configured to allocate the portion of the normal cell regions of the at least one of the plurality of semiconductor memory devices as the reserved region based on a designated vendor specific extended capability (DVESC).

20. A memory system comprising:
a memory module including a plurality of semiconductor memory devices; and
a memory controller connected to at least one host through a serial interface, the memory controller configured to control the plurality of semiconductor memory devices,
wherein each of the plurality of semiconductor memory devices includes a memory cell array that includes a normal cell region and a redundancy region, and wherein each of the plurality of semiconductor memory devices is configured to provide the memory controller with an address of at least a first defective memory cell row from among defective memory cell rows in the normal cell region as an unrepairable address information, the at least first defective memory cell row being unrepairable with a redundancy resource of the redundancy region, wherein the memory controller comprises:
  a bad block manager configured to allocate a portion of the normal cell regions of at least one of the plurality of semiconductor memory devices as a reserved region based on the unrepairable address information; and
  a remapping engine configured to remap a first unrepairable address to a first physical address of the reserved region in response to a first host physical address from the at least one host matching the first unrepairable address in the unrepairable address information, and to remap a second unrepairable address to a second physical address of the reserved region in response to a second host physical address from the at least one host matching the second unrepairable address in the unrepairable address information, wherein the first physical address and the second physical address are consecutive.

\* \* \* \* \*

UNITED STATES PATENT AND TRADEMARK OFFICE
CERTIFICATE OF CORRECTION

| | | |
|---|---|---|
| PATENT NO. | : 12,236,101 B2 | Page 1 of 1 |
| APPLICATION NO. | : 18/352509 | |
| DATED | : February 25, 2025 | |
| INVENTOR(S) | : Hyunseok Kim | |

It is certified that error appears in the above-identified patent and that said Letters Patent is hereby corrected as shown below:

On the Title Page

Item (54) and in the Specification Column 1, Lines 1-2, "MAMAGEMENT" is replaced with --MANAGEMENT--.

Signed and Sealed this
Thirteenth Day of May, 2025

Coke Morgan Stewart
*Acting Director of the United States Patent and Trademark Office*